US006144713A

United States Patent [19]
Eto

[11] Patent Number: 6,144,713
[45] Date of Patent: Nov. 7, 2000

[54] DELAY LOCKED LOOP CIRCUIT FOR CONTROLLING DELAY TIME WITH REDUCED LOCK-UP TIME

[75] Inventor: Satoshi Eto, Kawasaki, Japan

[73] Assignee: Fujitsu Limited, Kawasaki, Japan

[21] Appl. No.: 08/926,466

[22] Filed: Sep. 10, 1997

[30] Foreign Application Priority Data

Apr. 10, 1997 [JP] Japan .................................. 9-092455

[51] Int. Cl.[7] ..................................................... H03D 3/24
[52] U.S. Cl. ......................... 375/375; 375/362; 375/376; 327/161
[58] Field of Search ..................................... 375/362, 371, 375/373, 374, 375, 376; 327/141, 147, 151, 153, 156, 158, 160, 161; 331/1 A, 1 R, 2, 14, 17, 25; 365/195; 342/375; 386/15

[56] References Cited

U.S. PATENT DOCUMENTS

| | | | |
|---|---|---|---|
| 4,468,709 | 8/1984 | Kenjyo | 386/15 |
| 4,598,257 | 7/1986 | Southard | 331/2 |
| 5,036,297 | 7/1991 | Nakamura | 331/17 |
| 5,041,836 | 8/1991 | Paschen et al. | 342/375 |
| 5,118,975 | 6/1992 | Hillis et al. | 327/158 |
| 5,629,897 | 5/1997 | Iwamoto et al. | 365/195 |
| 5,635,875 | 6/1997 | Kusakabe | 331/1 A |
| 5,715,286 | 2/1998 | Itoh et al. | 375/376 |
| 5,870,002 | 2/1999 | Ghaderi et al. | 331/17 |

OTHER PUBLICATIONS

"A 256 Mb SDRAM Using a Register–Controlled Digital DLL", by Hatakeyama et al., 1997 Digest of Technical Papers and Slide Supplement, Feb. 1977.

*Primary Examiner*—Stephen Chin
*Assistant Examiner*—Chieh M. Fan
*Attorney, Agent, or Firm*—Arent Fox Kintner Plotkin & Kahn PLLC

[57] ABSTRACT

A phase comparator is adapted to output a predetermined number of pulse signals corresponding to the phase difference between a comparison reference signal and a comparison object signal to be compared therewith. This phase comparator is applied to a DLL (Delay Locked Loop) circuit having a delay circuit, a dummy delay circuit and a delay controller. Further, the phase comparator has a phase comparing section and a pulse number control section. The phase comparing section is used to make a judgement by comparing the phase difference between the comparison reference signal and the comparison object signal with a predetermined value, and the pulse number control section is used to control a number of pulses to be output according to a result of the judgement made by the phase comparing section. Thereby, when the phase difference between an external clock signal and an internal clock signal (namely, a comparison object signal and a comparison reference signal) at power-up and so forth is large, a quantity of delay which is corrected at a time can be increased. Consequently, the lock-up time of the DLL circuit can be reduced.

19 Claims, 28 Drawing Sheets

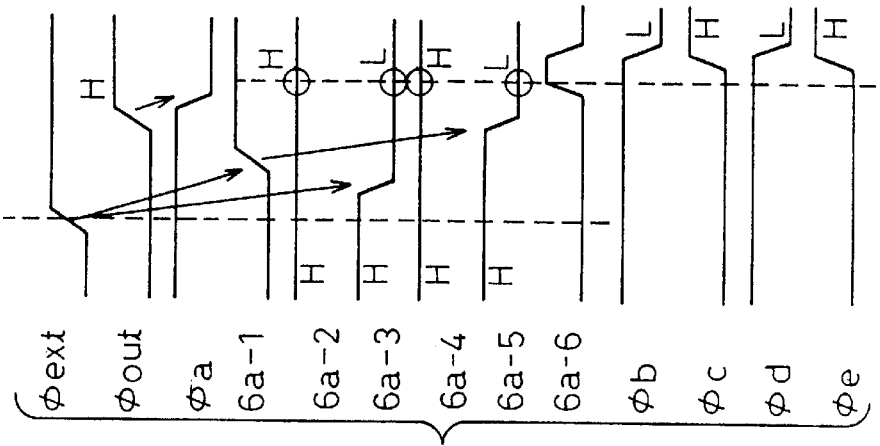
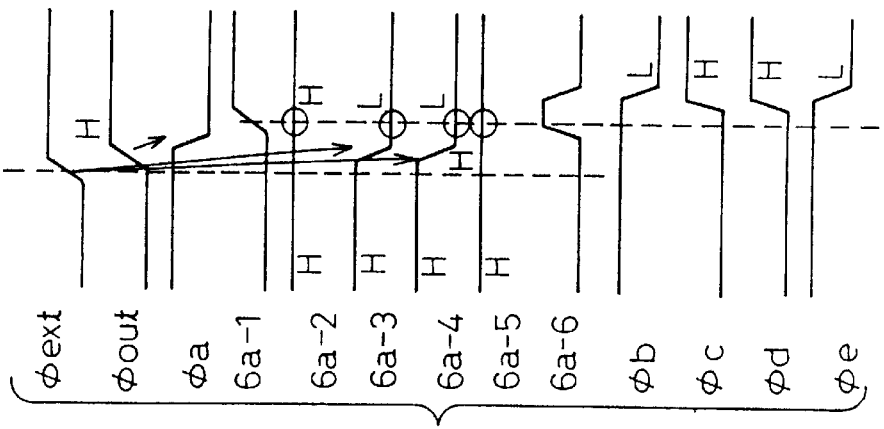
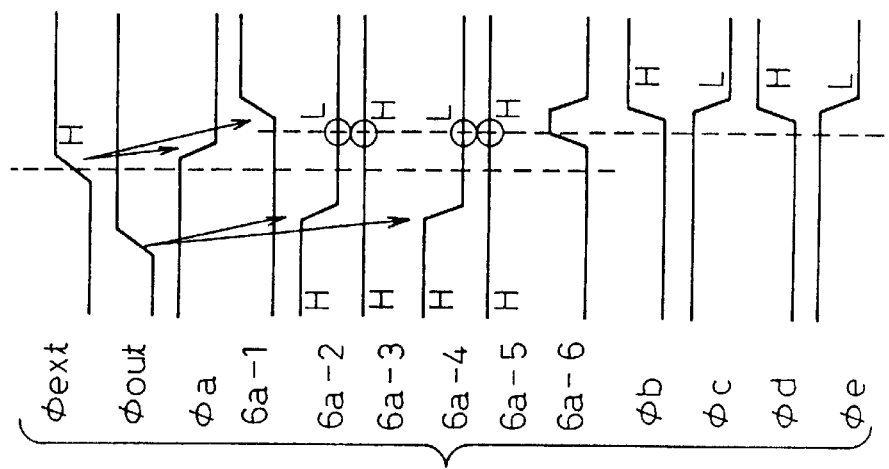

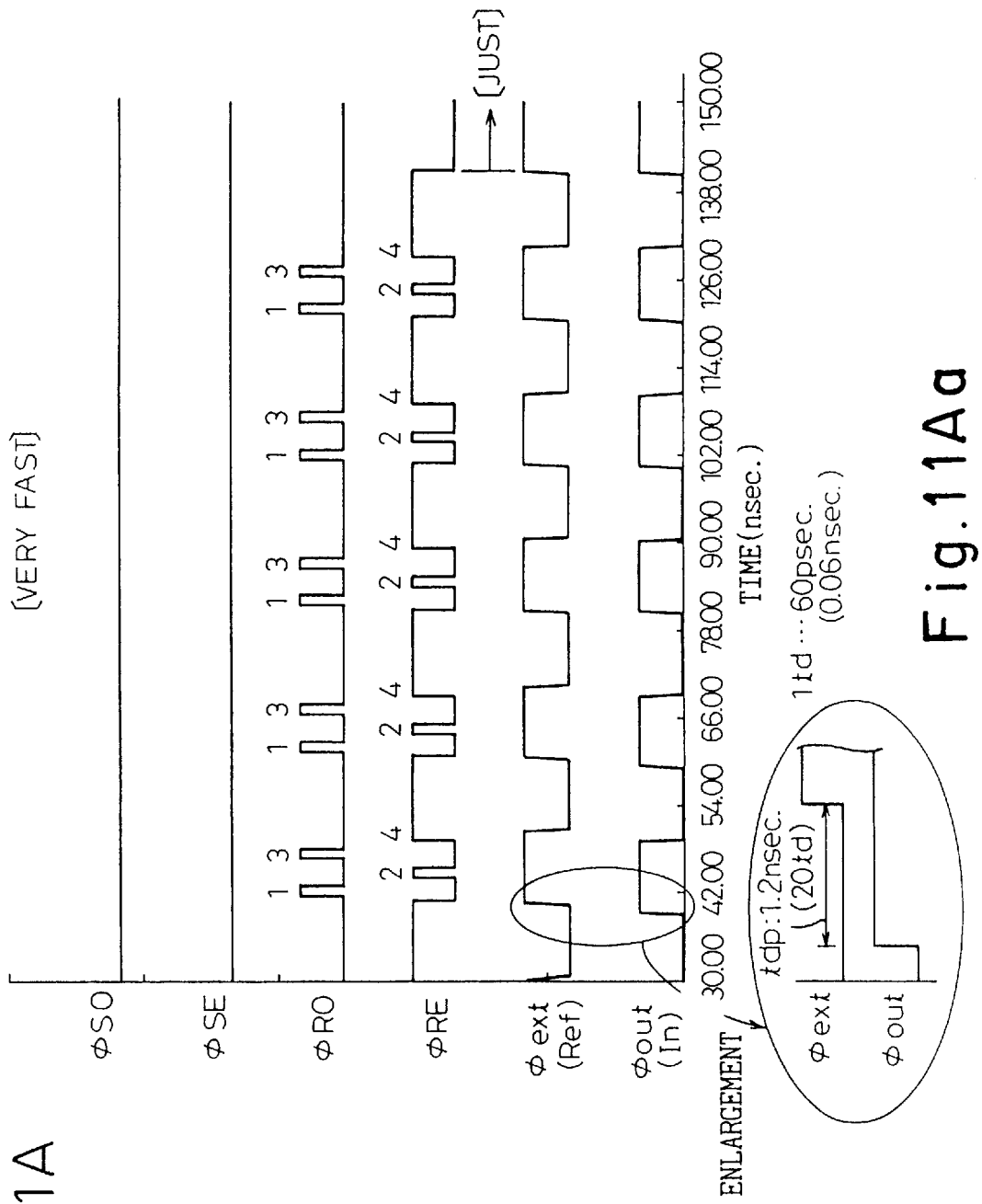

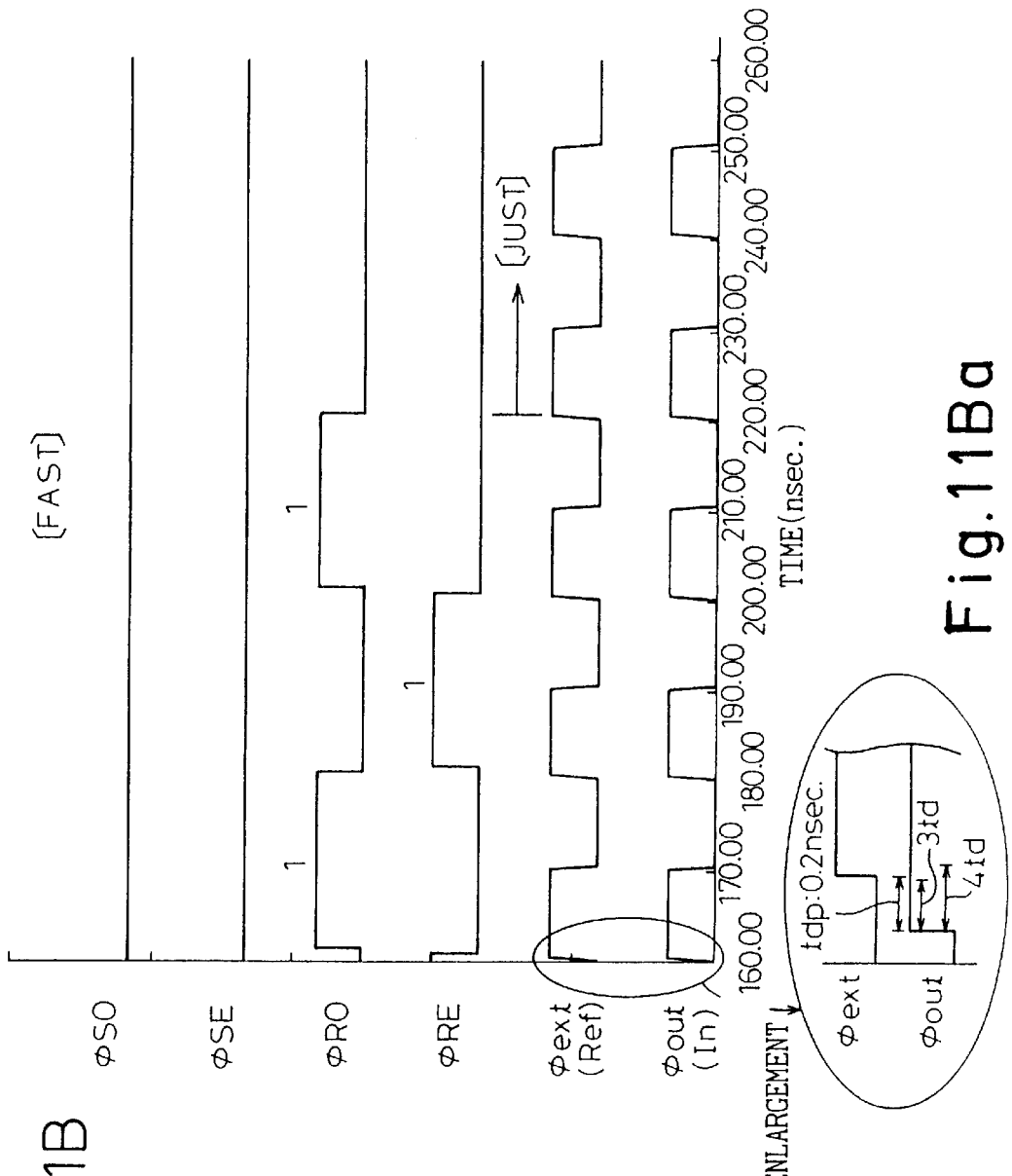

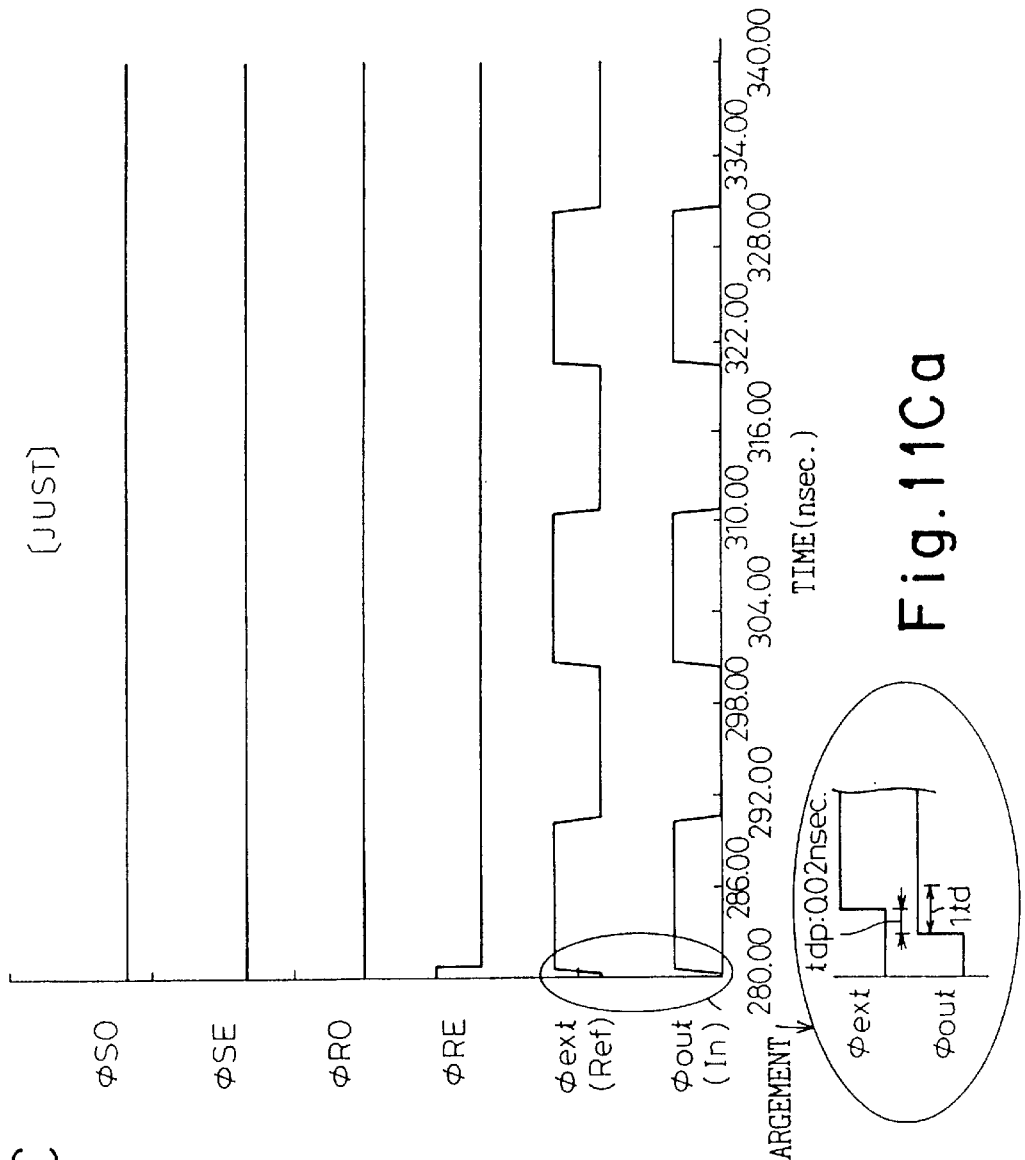

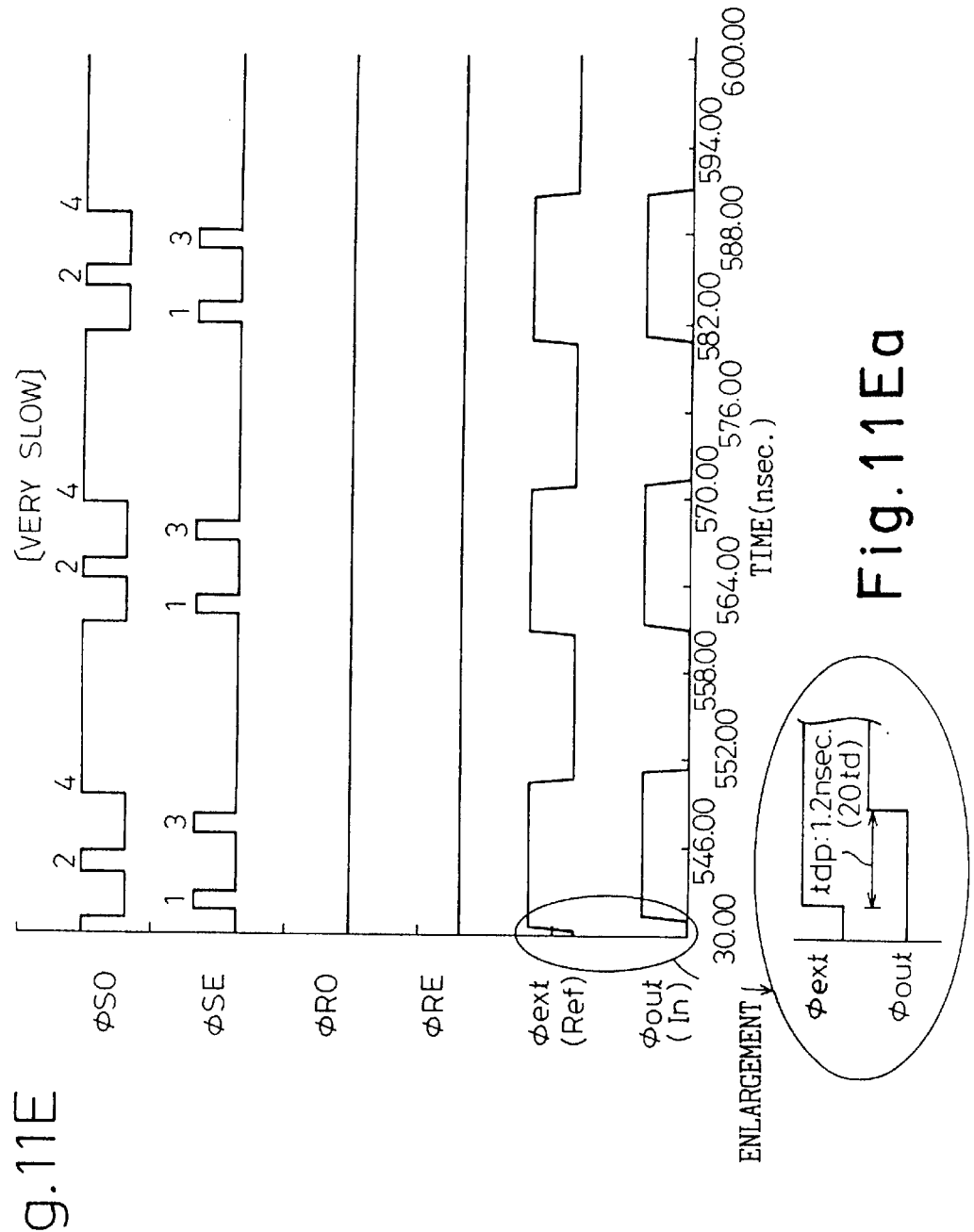

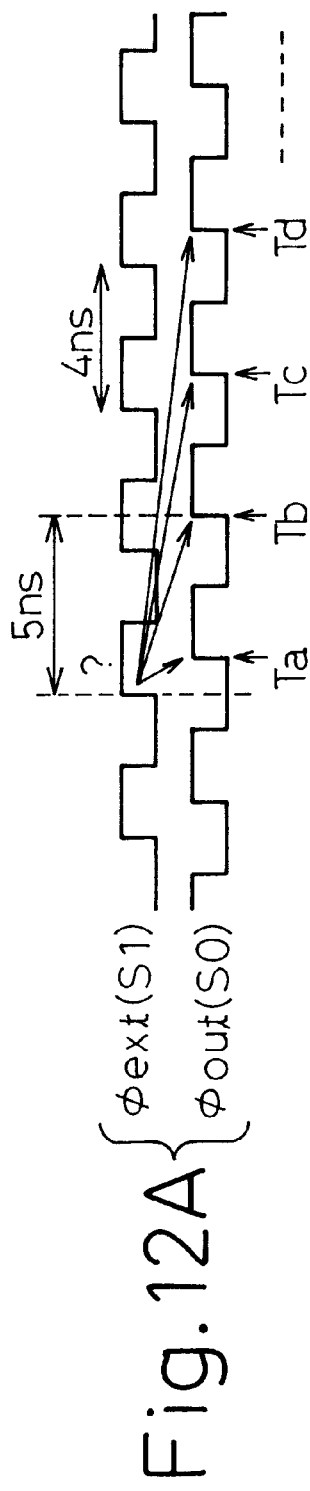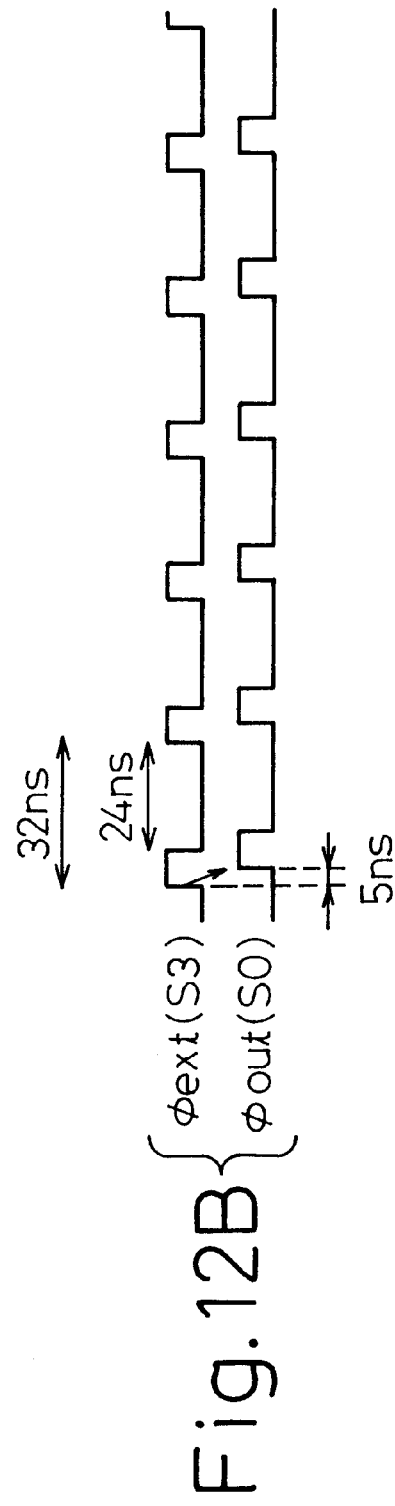

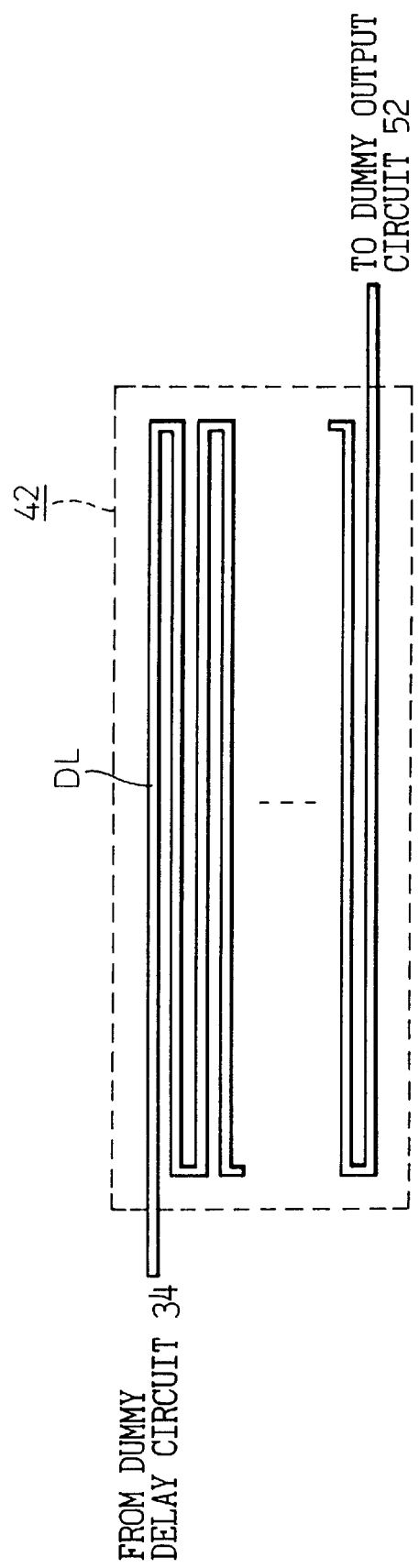

DELAY LOCKED LOOP CIRCUIT FOR CONTROLLING DELAY TIME WITH REDUCED LOCK-UP TIME

BACKGROUND OF THE INVENTION

1. Field of the Invention

The present invention relates to a phase comparator, a DLL (Delay Locked Loop) circuit and a semiconductor integrated circuit, and more particularly, to a phase comparator used in a DLL circuit for controlling delay time by using a delay stage and a shift register.

2. Description of the Related Art

Recently, semiconductor integrated circuits have been designed to realize high speed operation and low power consumption. For example, with regard to clock signals, it has become necessary to control a semiconductor integrated circuit by supplying phase synchronized clock signals to a predetermined circuit therein.

Concretely, memory devices developed in recent years have attained operation speeds that exceed 100 MHz, and thus, there has been used a method of making the phases of an external input clock signal and an internal clock signal coincide with each other by utilizing DLL techniques to thereby exclude the influence of a delay resulting from an internal clock wire or line so as to remove a delay or fluctuation of an access time.

In accordance with such DLL techniques, a memory device is adapted so that a dummy circuit is provided therein so as to estimate the propagation delay caused by an internal output clock signal line load.

Concretely, for example, a synchronous DRAM (SDRAM) is adapted so that signals phase-synchronized with external clock signals by using a DLL circuit are supplied to a plurality of output buffer circuits. There is a demand for reduction in the time taken until a DLL circuit locks up at power-up and at power-on/reset.

The related art phase comparator (DLL circuit) and problems associated therewith will be described in detail later with reference to drawings.

SUMMARY OF THE INVENTION

An object of the present invention is to shorten the time required for lock-up of a DLL circuit at power-up and so forth.

According to the present invention, there is provided a phase comparator including a section for outputting a predetermined number of pulse signals corresponding to a phase difference between a comparison reference signal and a comparison object signal to be compared therewith.

The phase comparator may comprise a phase comparing section for making a judgement by comparing the phase difference between the comparison reference signal and the comparison object signal with a predetermined value; and a pulse number control section for controlling a number of pulses to be output according to a result of the judgement made by the phase comparing section.

The phase comparing section may include a first phase comparing portion for making a judgment by comparing the phase difference between the comparison reference signal and the comparison object signal with a first value; and a second phase comparing portion for making a judgement by comparing the phase difference between the comparison reference signal and the comparison object signal with a second value, wherein the pulse control section controls a number of pulses to be output according to results of the judgments made by the first and second phase comparing portions. The pulse number control section may comprise an oscillator circuit for generating pulse signals; a counter circuit for counting an output of the oscillator circuit; and an oscillator control circuit for controlling an operation of the oscillator circuit according to a count value of the counter circuit and a result of the judgement made by the phase comparing section.

Further, according to the present invention, there is provided a delay locked loop circuit comprising a delay circuit for applying a delay amount to a first input control signal and for outputting a second control signal; a dummy delay circuit for receiving a signal corresponding to the first control signal and for outputting a signal to which a same delay amount as applied by the delay circuit is applied; a delay control circuit for controlling both of the delay amounts in the delay circuit and the dummy delay circuit as a same value; and a phase comparator, for receiving a signal corresponding to the first control signal as a comparison reference signal, for receiving an output signal from the dummy delay circuit through a predetermined circuit as a comparison object signal, and for supplying a predetermined number of pulse signals to the delay control circuit according to a phase difference between the comparison reference signal and the comparison object signal, thereby controlling a delay amount in each of the delay circuit and the dummy delay circuit.

The phase comparator may comprise a phase comparing section for making a judgement by comparing the phase difference between the comparison reference signal and the comparison object signal with a predetermined value; and a pulse number control section for controlling a number of pulses to be output according to a result of the judgement made by the phase comparing section. The predetermined value to be compared with the phase difference between the comparison reference signal and the comparison object signal may be determined by using a delay amount of a single delay stage which is a unit element for constituting the delay circuit and the dummy delay circuit. The phase comparing section may comprise a first phase comparing portion for making a judgment by comparing the phase difference between the comparison reference signal and the comparison object signal with a first delay amount of m delay stages, where m is a natural number; and a second phase comparing portion for making a judgement by comparing the phase difference between the comparison reference signal and the comparison object signal with a second delay amount of n delay stages, where n is a natural number; and m is smaller than n, wherein the pulse control section controls a number of pulses to be output according to results of the judgments made by the first and second phase comparing portions.

The phase comparing section may be adapted to set "JUST" as a result of the judgement if the phase difference between the comparison reference signal and the comparison object signal is less than the first delay amount of m delay stages, and to set the number of pulses output by the pulse number control section at zero and to maintain the delay amounts caused in the delay circuit and the dummy delay circuit; wherein the phase comparing section may be adapted to set "FAST" or "SLOW" as a result of the judgement if the phase difference between the comparison reference signal and the comparison object signal is not less than the first delay amount of m delay stages and is not more than the second delay amount of n delay stages, and to set the number of pulses output by the pulse number control section at a first number and to correct the delay amount caused in each of the delay circuit and the dummy delay circuit; and wherein the phase comparing section may be adapted to set "VERY FAST" or "VERY SLOW" as a result of the judgement if the phase difference between the comparison reference signal and the comparison object signal is more than the second delay amount of n delay stages, and to set the number of pulses output by the pulse number control section at a second number that is more than the first number, and to correct the delay amount caused in each of the delay circuit and the dummy delay circuit by an amount that is more than an amount by which the delay amount is corrected in a case where the number of pulses is set at the first number.

The control signal supplied from the phase comparator to the delay control circuit may include an addition control signal for even-numbered delay stages, an addition control signal for odd-numbered delay stages, a subtraction control signal for even-numbered delay stages, and a subtraction control signal for odd-numbered delay stages; wherein the addition control signal for even-numbered delay stages and/or the addition control signal for odd-numbered delay stages may be output according to the number of pulses, which are output by the pulse number control portion, and the delay amount caused in each of the delay circuit and the dummy delay circuit may be increased when a phase of the comparison object signal is ahead of a phase of the comparison reference signal; and wherein the subtraction control signal for even-numbered delay stages and/or the subtraction control signal for odd-numbered delay stages may be output according to the number of pulses, which are output by the pulse number control portion, and the delay amount caused in each of the delay circuit and the dummy delay circuit may be decreased when the phase of the comparison object signal is behind the phase of the comparison reference signal.

The pulse number control section may comprise an oscillator circuit for generating pulse signals; a counter circuit for counting an output of the oscillator circuit; and an oscillator control circuit for controlling an operation of the oscillator circuit according to a count value of the counter circuit and a result of the judgement made by the phase comparing section. The delay control circuit may include a shift register, and a pulse signal output from the pulse number control signal may be adapted to determine a delay amount caused in each of the delay circuit and the dummy delay circuit which are controlled by the shift register.

The delay locked loop circuit may further comprise a frequency divider circuit to which the first control signal is supplied, and an output signal of the frequency divider circuit may be supplied to the dummy delay signal and is also supplied as the comparison reference signal for the phase comparator.

In addition, according to the present invention, there is also provided a semiconductor integrated circuit having a delay locked loop circuit, the delay locked loop circuit comprising a delay circuit for applying a delay amount to a first input control signal and for outputting a second control signal; a dummy delay circuit for receiving a signal corresponding to the first control signal and for outputting a signal to which a same delay amount as applied by the delay circuit is applied; a delay control circuit for controlling both of the delay amounts in the delay circuit and the dummy delay circuit as the same value; and a phase comparator, for receiving a signal corresponding to the first control signal as a comparison reference signal, for receiving an output signal from the dummy delay circuit through a predetermined circuit as a comparison object signal, and for supplying a predetermined number of pulse signals to the delay control circuit according to a phase difference between the comparison reference signal and the comparison object signal, thereby controlling a delay amount in each of the delay circuit and the dummy delay circuit, wherein the second control signal output from the delay circuit is supplied to an object circuit through a real line, an output signal of the dummy delay circuit is supplied to the phase comparator through a dummy section corresponding to both of the real line and the object circuit as the comparison object signal.

The semiconductor integrated circuit may be a synchronous DRAM, wherein the object circuit is an output circuit of the synchronous DRAM.

BRIEF DESCRIPTION OF THE DRAWINGS

The present invention will be more clearly understood from the following description of preferred embodiments with reference to the accompanying drawings, in which like reference characters designate like or corresponding parts throughout several views, and in which:

FIGS. 4A, 4B and 4C are timing charts for illustrating an operation of the phase comparator of FIG. 3;

FIGS. 11A, 11B, 11C, 11D and 11E are diagrams illustrating results of simulation of the phase comparator shown in FIGS. 10A and 10B, respectively;

FIGS. 12A and 12B are diagrams for illustrating timing provided in the phase comparator shown in FIGS. 10A and 10B;

FIG. 23 is a diagram for illustrating the configuration of an example of a dummy internal output clock line (namely, a dummy line) provided in the semiconductor integrated circuit of the present invention.

DESCRIPTION OF THE PREFERRED EMBODIMENTS

First, before describing examples of the semiconductor integrated circuit of the present invention, the semiconductor integrated circuits according to the related art arid problems, which such semiconductor integrated circuits have, will be described hereinbelow by referring to the accompanying drawings.

Figure 1:
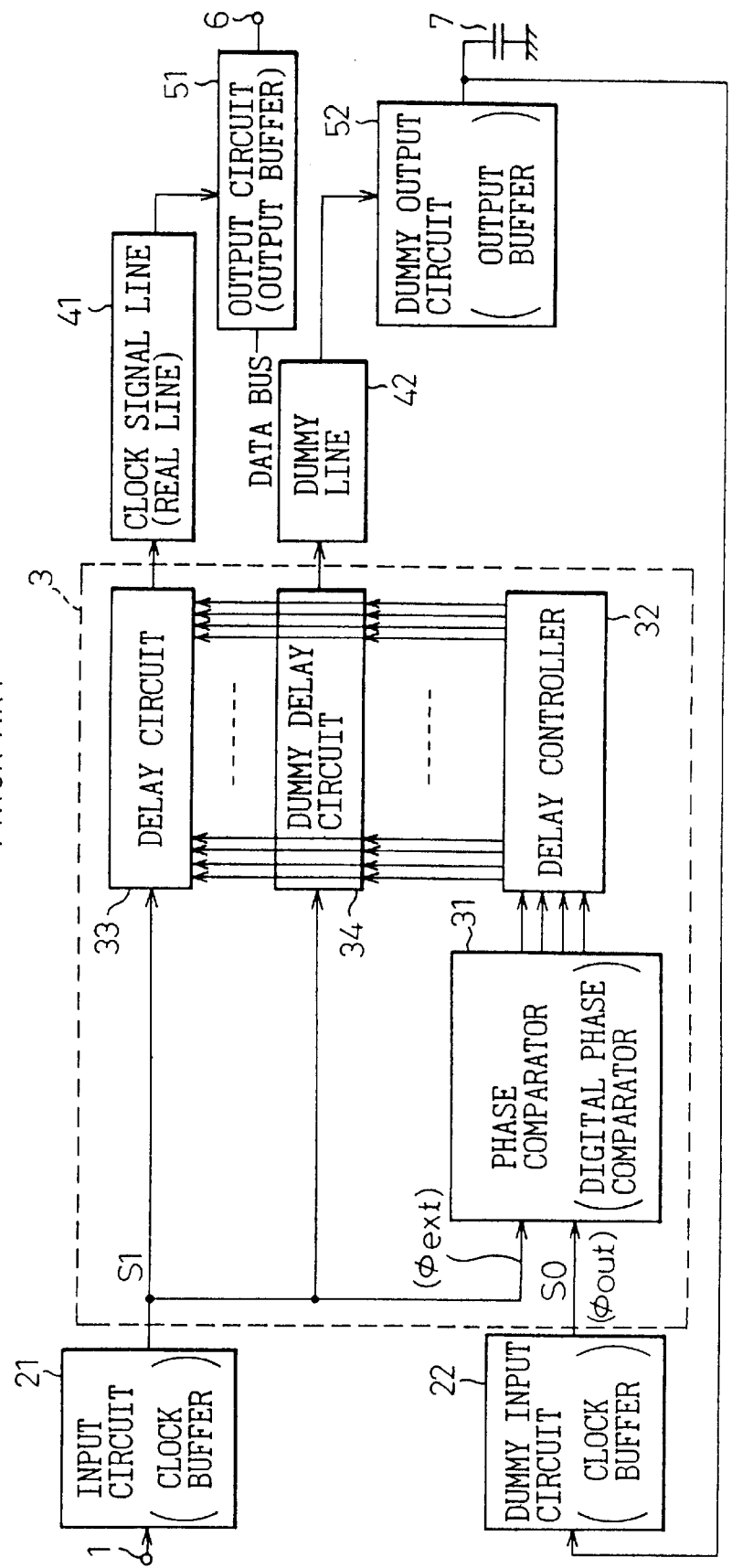
FIG. 1 is a block diagram showing an example of a semiconductor integrated circuit according to the related art.

FIG. 1 is a block diagram showing an example of the semiconductor integrated circuit according to the related art. In this figure, reference numeral 1 designates a clock input pad; 21 an input circuit (namely, a clock buffer); 22 a dummy input circuit (namely, a clock buffer); and 3 a DLL circuit. Further, reference numeral 41 denotes a clock signal line (namely, a real line); 42 denotes a dummy line, 51 an output circuit (namely, an output buffer); 6 a data output pad; and 7 a dummy load capacitor.

As shown in FIG. 1, the DLL circuit 3 comprises a phase comparator (namely, a digital phase comparator) 31, a delay controller 32, a delay circuit 33, and a dummy delay circuit 34. An external clock (namely, an externally input clock signal) CLK is supplied to the phase comparator 31 through the input circuit 21 (see signal S1), and the external clock CLK is also supplied to the phase comparator 31 through the dummy delay circuit 34, the dummy line 42, the dummy output circuit 52 and the dummy input circuit 22 (see signal S0). These signals S1 and S0 are phase-compared with each other by the phase comparator 31. Thus, the delay controller 32 is controlled by output signals of the phase comparator 31. Note that the signal S0 supplied to the phase comparator 31 through the dummy input circuit 22 is obtained by delaying the passage of the external clock CLK by just one clock cycle by means of the dummy line 42 and the like when performing a normal operation. This signal S0 delayed by just one clock cycle is phase-compared with the signal S1, which is supplied through the input circuit 21, by the phase comparator 31. Incidentally, at power-up and at power-on/reset, the signal S1 may be phase-compared with the signal S0 delayed by two or several clock cycles owing to a delay caused in operating initial states of the dummy input circuit 22, the dummy line 42 and the dummy output circuit 52.

Meanwhile, for instance, when the phase difference between the signals S1 and S0 to be input to the phase comparator 31 is 180 degrees, there is no time period when both of the signals S1 and S0 to be compared have a high level "H", so that the phase comparator 31 cannot make a phase comparison therebetween.

The delay controller 32 is adapted to control the delay circuit 33 and the dummy delay circuit 34 in such a way as to apply a same delay amount in accordance with outputs of the phase comparator 31. Therefore, a clock signal (namely, an internal clock signal) for the output circuit 51 is supplied thereto at timing at which no delay is apparently caused by the input circuit 21, the delay circuit 33, the clock line (namely, the real line) 41, and the output circuit 51.

Meanwhile, when the operation speed of the SDRAM is further increased and the period (namely, the clock cycle) of the external clock CLK is further shortened, the aforementioned delay caused by the dummy line 42 and so on becomes longer than one clock cycle of the external clock CLK. To put it concretely, when a total of a delay time of the input circuit 21, a minimum delay time of the delay circuit 33, a delay time of the real line 41 and a delay time of the output circuit 51 (corresponding to a total of a delay time of the dummy input circuit 22, a minimum delay time of the dummy delay circuit 34, a delay time of the dummy line 42, and a delay time of the dummy output circuit 52) is longer than a time period corresponding to one external clock CLK (namely, one clock cycle thereof), the phase comparator 31 cannot make a phase comparison between a signal Sl, which is supplied thereto through the input circuit 21, and an output signal S0 of the dummy input circuit 22. Namely, a phase-synchronized internal clock cannot be generated from an external clock that precedes by one clock cycle.

Figure 2:
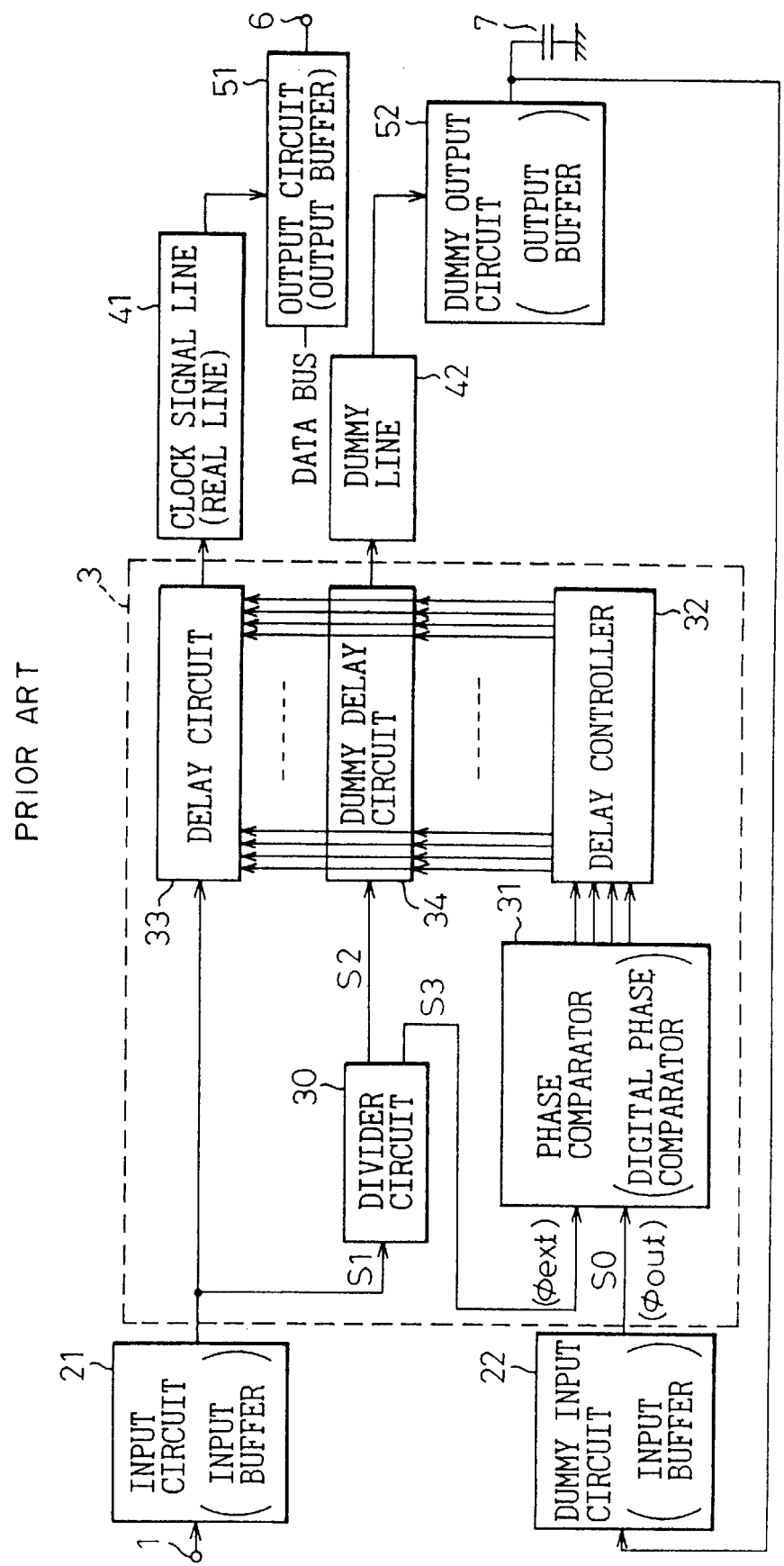
FIG. 2 is a block diagram showing another example of a semiconductor integrated circuit according to the related art.

FIG. 2 is a block diagram showing another example of a semiconductor integrated circuit according to the related art. This semiconductor integrated circuit of FIG. 2 is obtained by improving the configuration of the DLL circuit 3 of the semiconductor integrated circuit shown in FIG. 1. The rest of the configuration of the semiconductor integrated circuit of FIG. 2 is similar to the corresponding section of the semiconductor integrated circuit of FIG. 1.

As shown in FIG. 2, the DLL circuit 3 comprises a (frequency) divider circuit 30, a phase comparator (namely, a digital phase comparator) 31, a delay controller 32, a delay circuit 33, and a dummy delay circuit 34. The divider circuit 30 is supplied with an external clock CLK (namely, a signal S1: a first control signal) through the input circuit 21 and is adapted to output a signal obtained by dividing a frequency of the external clock CLK. Namely, the divider circuit 30 outputs a first output signal (that is, a signal S2) to the dummy delay circuit 34, and also outputs a second output signal (namely, a signal S3) to a first input terminal of the phase comparator 31. The first output signal (namely, a signal S2) of the divider circuit 30 is supplied to a second input terminal of the phase comparator 31 (as a signal S0) through the dummy delay circuit 34, the dummy line 42, the dummy output circuit 52, and the dummy input circuit 22. Further, the aforesaid phase comparator 31 is adapted to control the delay controller 32 by making a phase comparison between these signals S3 and S0. Incidentally, the output signal (namely, a second control signal) of the delay circuit 33 is supplied to the output circuit (namely, an object circuit) 51 through the real line 41 as an output signal of the DLL circuit 3.

The delay controller 32 is adapted to control the delay circuit 33 and the dummy delay circuit 34 in such a manner as to provide the same delay amounts thereto in accordance with outputs (namely, results of the phase comparison) of the phase comparator 31. Therefore, a clock signal (namely, an internal clock signal) for the output circuit 51 is supplied thereto at timing at which no delay is apparently caused by the input circuit 21, the delay circuit 33, the real line 41, and the output circuit. 51.

Meanwhile, when one period of the external clock CLK is shorter than a total delay caused by the input circuit 21, the real line (signal line) 41 and the output circuit 51, a synchronous internal clock cannot be generated from an external clock CLK, which precedes by one clock cycle, by using the DLL circuit 3. Thus, in the case that the period of the external clock CLK is shorter than the delay caused by the wire or line, the internal clock (signal) is generated from an external clock CLK, which precedes by two clock cycles, instead of the external clock CLK that precedes by one clock cycle. Namely, the phase comparator 31 is adapted to perform a phase comparison operation at timing delayed by two clock cycles of the external clock CLK.

Namely, when a phase comparison is made by the phase comparator 31, a leading edge of "the clock output from the DLL circuit 3" and a leading edge of "the external clock delayed by two clock cycles of the external clock, which is input to the DLL circuit 3," are synchronized with each other (namely, are locked) by the (frequency) divider circuit 30 (to be described later). Namely, differently from the semiconductor integrated circuit illustrated in FIG. 1, the semiconductor integrated circuit (that is, the DLL circuit) shown in FIG. 2 is provided with the divider circuit 30, which is supplied with an output signal of the input circuit 21, and is adapted so that a first output signal S2 of the aforesaid divider circuit 30 is supplied to the dummy delay circuit 34 and that a second output signal S3 of the divider circuit 30 is supplied to a first input terminal of the phase comparator 31. Note that the phase comparison to be made by the phase comparator 31 can be enabled by providing the divider circuit 30 in the semiconductor integrated circuit, because there is a time period in which both of the signals S3 and S0 to be input to the phase comparator 31 have the high level "H" even in the case that the phases of the signals S1 and S0 are different from each other by 180 degrees. Moreover, as a result of providing the divider circuit 30 therein, the power consumption thereof can be reduced by lowering the frequency of sampling (namely, of the phase comparison).

Figure 3:
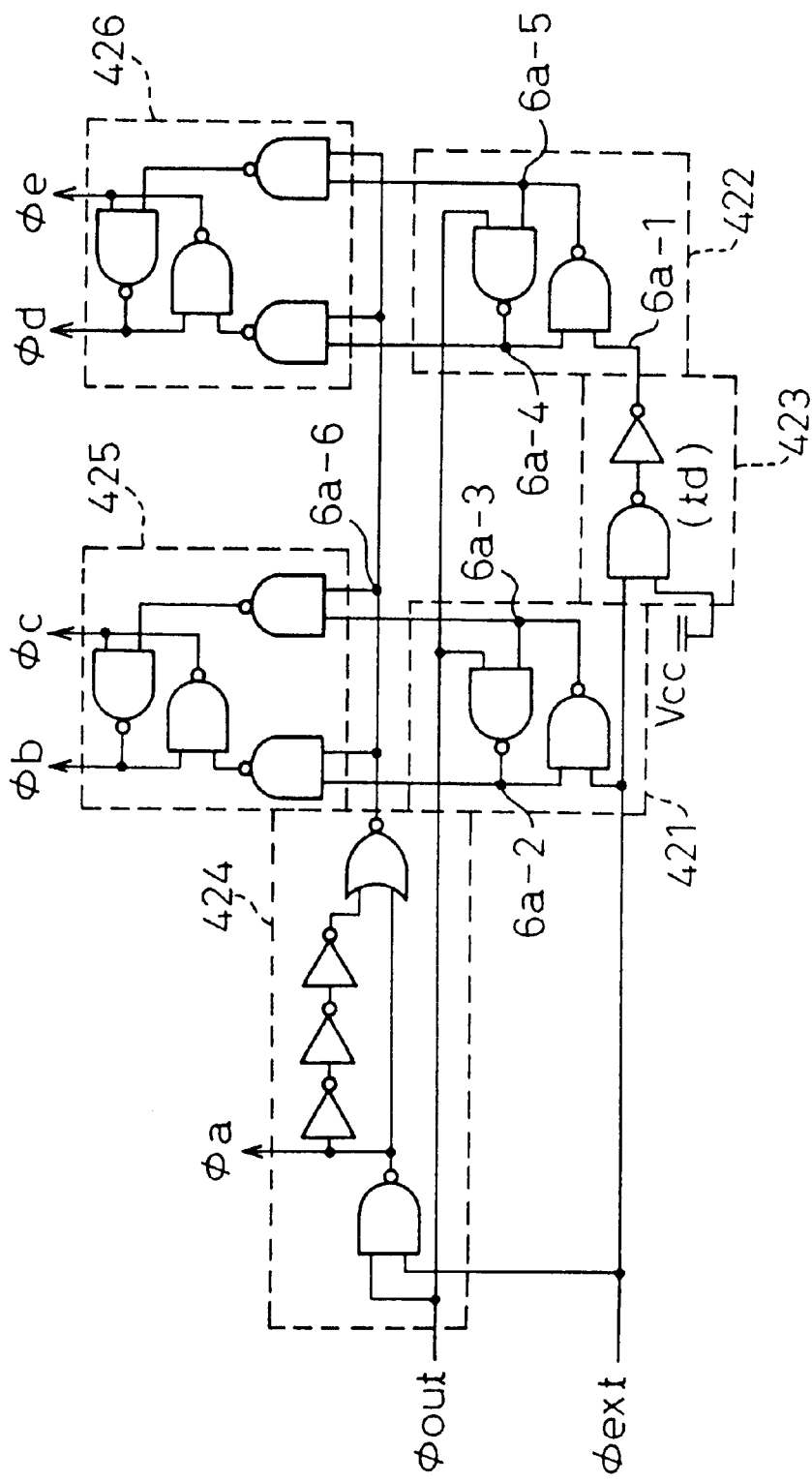
FIG. 3 is a diagram for illustrating the configuration of an example of a phase comparator (namely, a phase comparing section) according to the related art to be used in the semiconductor integrated circuits of FIGS. 1 and 2.

FIG. 3 is a diagram for illustrating the configuration of an example of the phase comparator (namely, the phase comparing section) according to the related art to be used in the semiconductor integrated circuits of FIGS. 1 and 2. FIGS. 4A, 4B and 4C are timing charts for illustrating an operation of the phase comparator of FIG. 3.

The phase comparator 31 of the semiconductor integrated circuits of FIGS. 1 and 2 is composed of two circuit sections, namely, the phase comparing section shown in FIG. 3 and the amplifying circuit section illustrated in FIG. 5 (to be described later). In FIG. 3, reference characters $\phi_{out}$ and $\phi_{ext}$ denote an output signal and an external clock signal to be compared in this phase comparator, respectively. The phase of the signal (namely, a comparison object signal) $\phi_{out}$ to be compared is determined on the basis of a signal (namely, a comparison reference signal) $\phi_{ext}$. Further, reference characters $\phi_1$ to $\phi_a$ designate output signals to be connected to the amplifying circuit section, respectively.

Figure 10A:
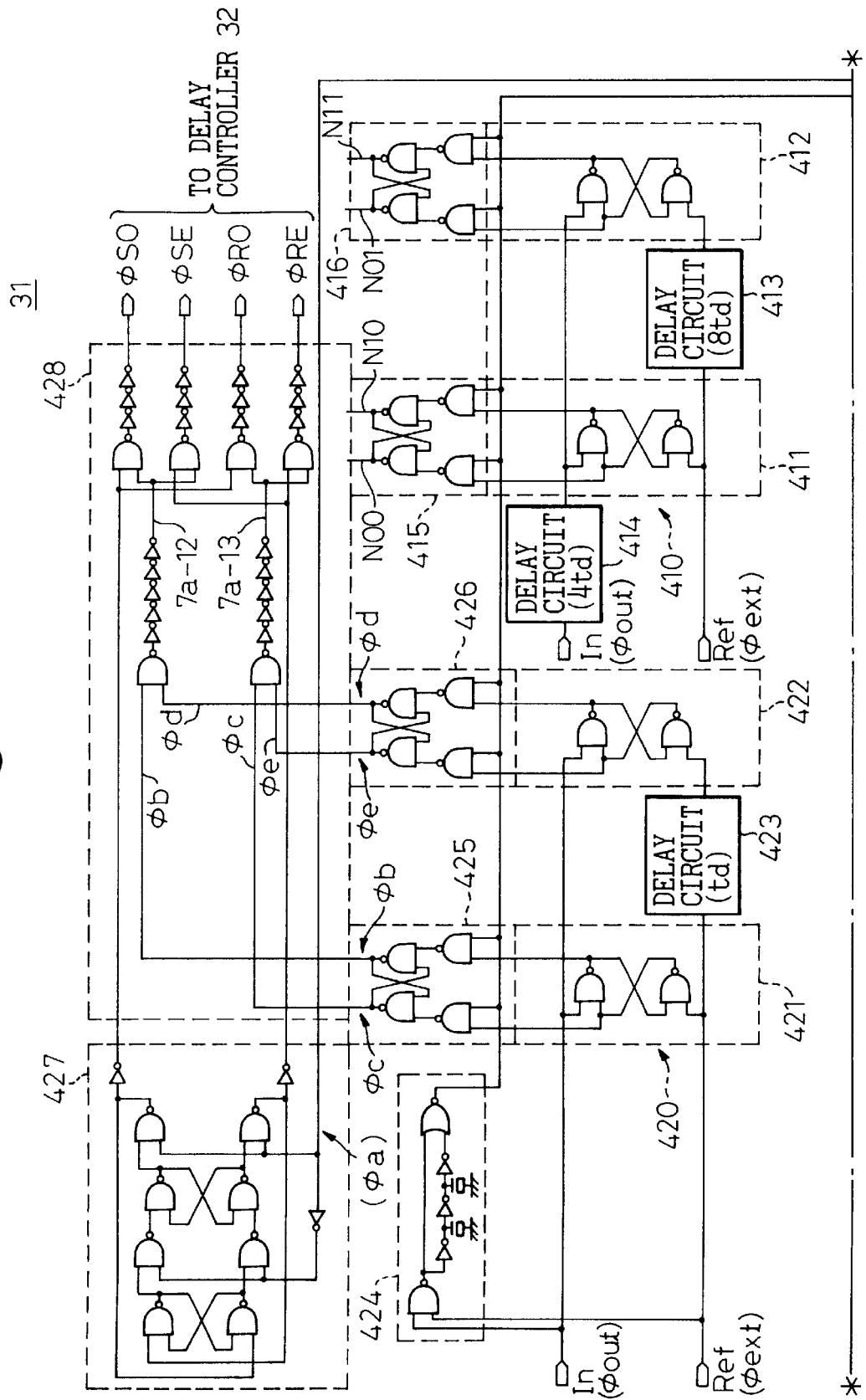
FIGS. 10A and 10B are circuit diagrams showing an example of a phase comparator provided in the semiconductor integrated circuit of the present invention.
Figure 10B:
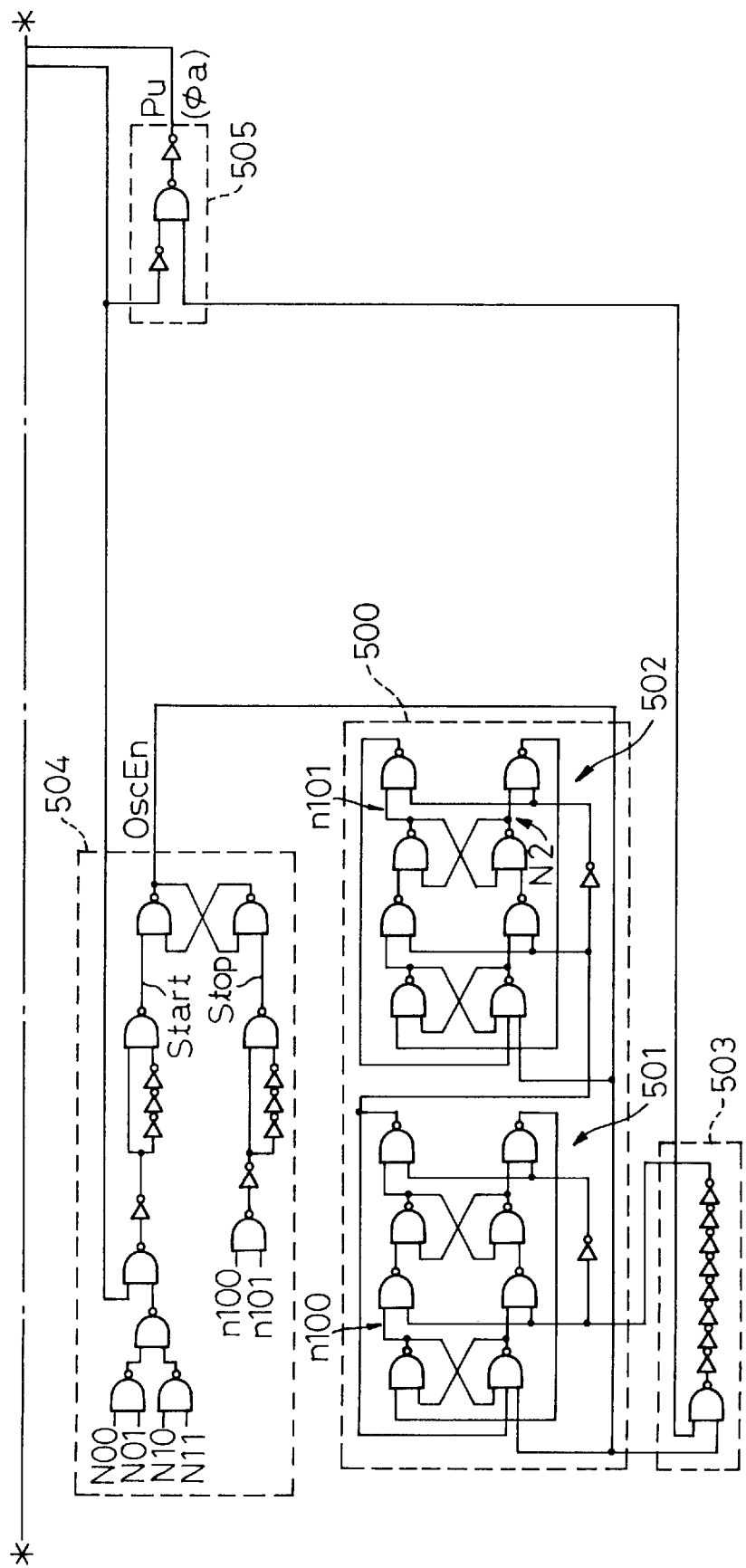

Meanwhile, a phase comparator (to be described later), which is illustrated in FIGS. 10A and 10B as an embodiment of the present invention, corresponds to the phase comparator provided with the phase comparing section of FIG. 3 and the amplifying circuit section of FIG. 5 and can be applied to the semiconductor integrated circuit (namely, the DLL circuit 3) illustrated in FIG. 2 as the phase comparator 31 without being modified. Furthermore, the phase comparator illustrated in FIGS. 10A and 10B as an embodiment of the present invention can be also applied to the semiconductor integrated circuit illustrated in FIG. 1 as the phase comparator 31.

As shown in FIG. 3, the phase comparing section of the phase comparator 31 comprises: flip-flop circuits 421 and 422, each of which consists of two NAND gates; latch circuits 425 and 426 each for latching the state of a corresponding one of the flip-flop circuits 421 and 422; an activation signal generator 424 for generating activation signals used in the latches 425 and 426; and a delay circuit 423 for causing a time delay by one delay time unit and for obtaining a phase tolerance for the external clock signal $\phi_{ext}$.

FIG. 4A illustrates the case that the phase of the comparison object signal $\phi_{out}$ is ahead of the phase of the comparison reference signal $\phi_{ext}$, namely, the case that the signal level of the signal $\phi_{out}$ changes from a low level "L" to the high level "H" before the signal $\phi_{ext}$ changes in a similar manner. When both of the signals $\phi_{out}$ and $\phi_{ext}$ are at the low level "L", all nodes 6a-2, 6a-3, 6a-4 to 6a-5 of the flip-flops 421 and 422 are at the high level "H". When the signal level of the signal $\phi_{out}$ changes from the low level "L" to the high level "H", both of the nodes 6a-2 and 6a-4 change from the high level "H" to the low level "L". Thereafter, the signal level of the signal $\phi_{ext}$ changes from the low level "L" to the high level "H". Further, after being delayed by one delay time unit, the signal level of the node 6a-1 changes from the low level "L" to the high level "H". However, the terminal voltages of the flip-flops 421 and 422 have already been fixed and thus do not change at all. Consequently, the signal level of the node 6a-2 is maintained at the low level "L"; that of the node 6a-3 at the high level "H"; that of the node 6a-4 at the low level "L"; and that of the node 6a-5 at the high level "H".

In contrast, in response to a change in the signal level of the signal $\phi_{ext}$ from the low level "L" to the high level "H", the signal level of the output signal $\phi_a$ of the generator 424 changes from the high level "H" to the low level "L". Further, a pulse, whose signal level transitorily becomes the high level "H", is applied to the node 6a-6. Because the node 6a-6 is connected to the NAND gates of the latches 425 and 426, the NAND gates are temporarily activated, so that the latches 425 and 426 latch the terminal voltages of the flip-flips 421 and 422. Finally, the signal level of the output signal $\phi_b$ changes to the high level "H"; that of the signal $\phi_c$ to the low level "L"; that of the signal $\phi_d$ to the high level "H"; and that of the signal $\phi_e$ to the low level "L".

Furthermore, FIG. 4C illustrates the case that the phase of the comparison object signal $\phi_{out}$ is behind the phase of the comparison reference signal $\phi_{ext}$ and that the signal level of the signal $\phi_{out}$ changes from the low level "L" to the high level "H" after the signal $\phi_{ext}$ changes in a similar manner. In this case, the signal $\phi_{ext}$ causes changes in the flip-flops 421 and 422, so that the signal level of the nodes 6a-3 and 6a-5 change from the high level "H" to the low level "L". Then, finally, the signal level of the output signal $\phi_b$ changes to the low level "L"; that of the signal $\phi_c$ to the high level "H"; that of the signal $\phi_d$ to the low level "L"; and that of the signal $\phi_e$ to the high level "H".

In this way, by using a rise moment of the signal (namely, the comparison reference signal) $\phi_{ext}$ as a reference, it is made possible to determine whether a rise of the signal level of the dummy internal clock signal $\phi_{out}$ to the high level "H"

is ahead of, nearly simultaneous with, or behind the rise of the signal $\phi_{ext}$. Data representing results of the determination is latched as values represented by the output signals $\phi_b$, $\phi_c$, $\phi_d$ and $\phi_e$, respectively. According to these values, it is determined whether data indicated by the delay controller is incremented or decremented.

Figure 5:
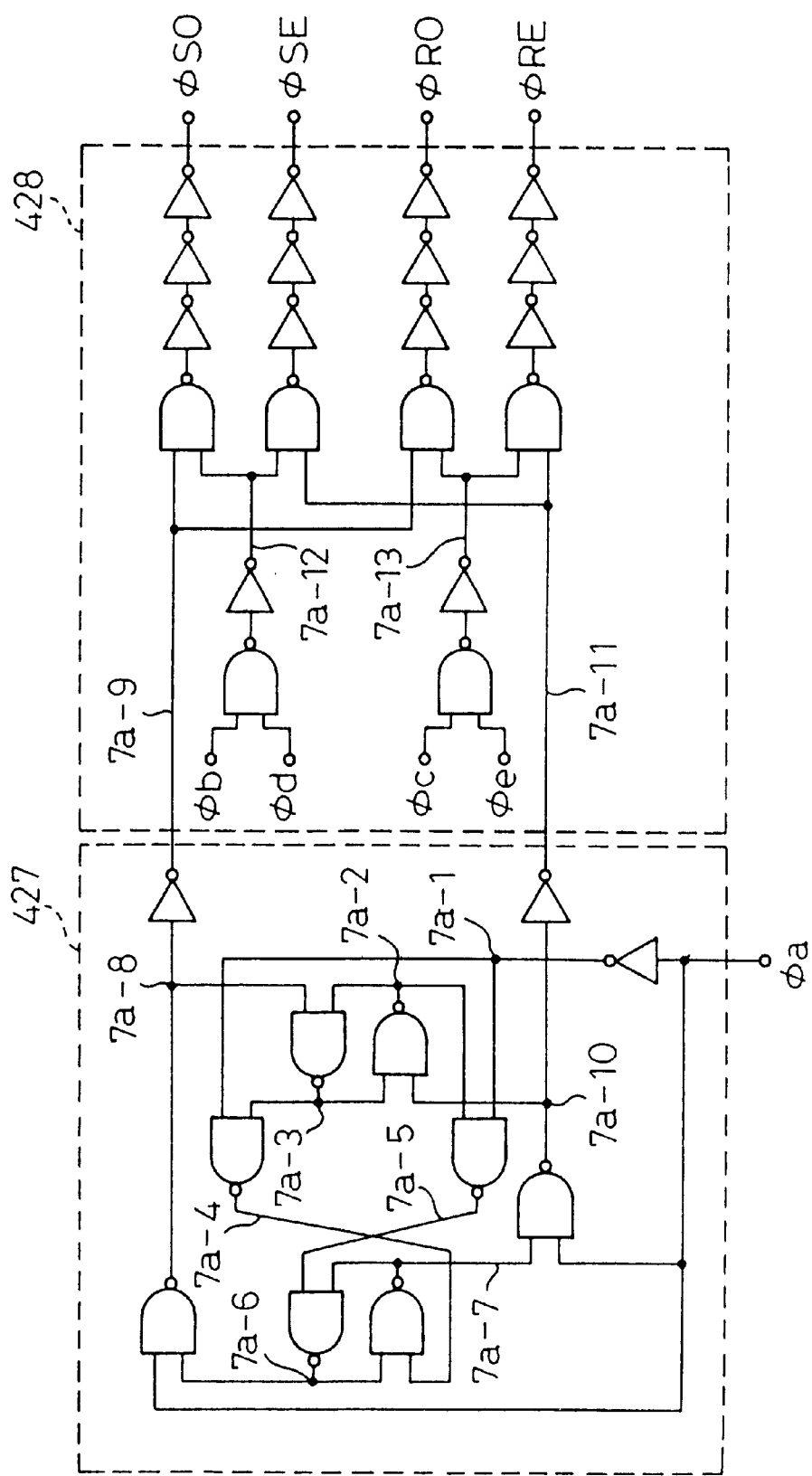
FIG. 5 is a diagram for illustrating the configuration of an example of a phase comparator (namely, an amplifying circuit section) according to the related art to be used in the semiconductor integrated circuits of FIGS. 1 and 2.
Figure 6:
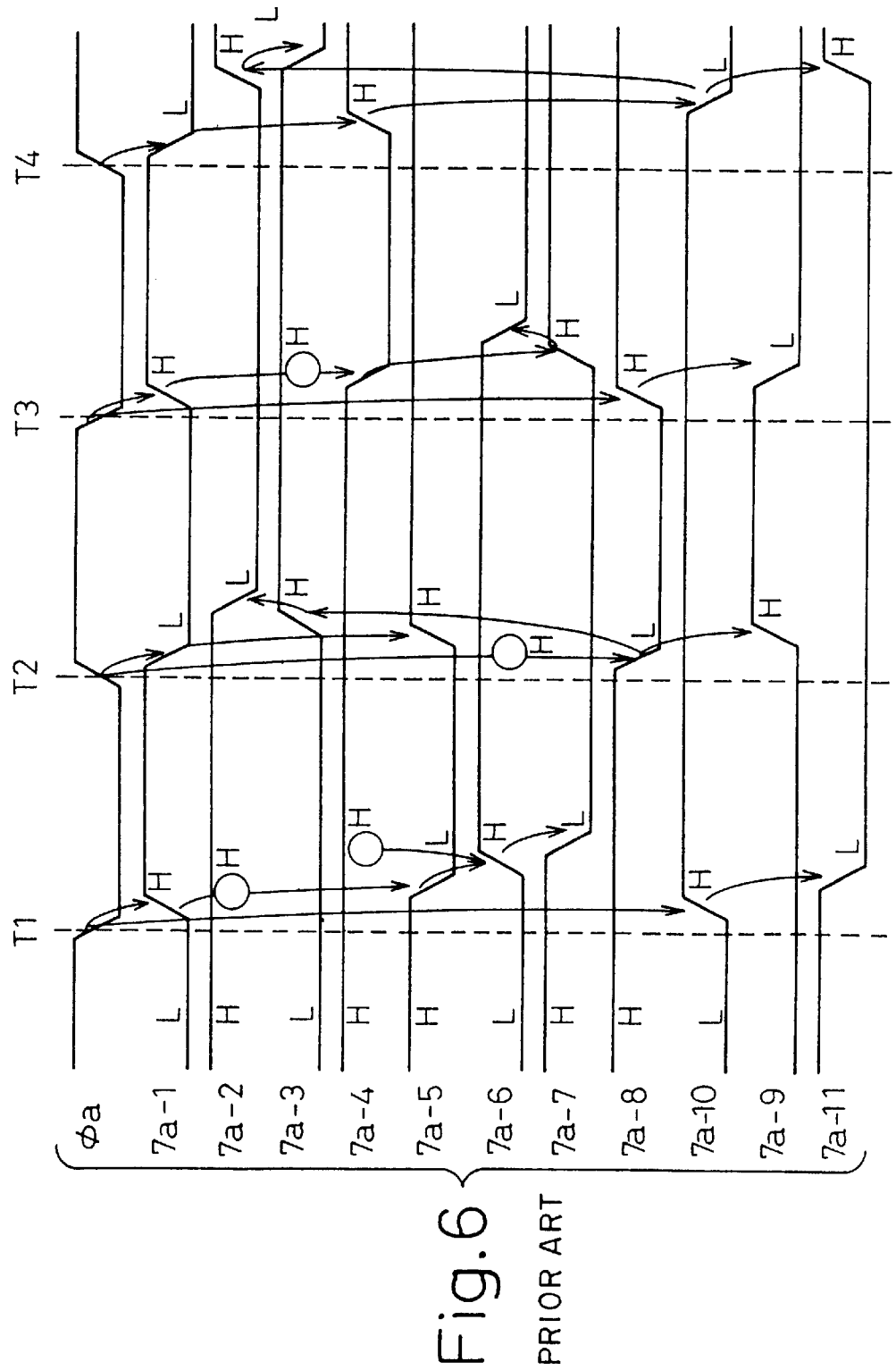
FIG. 6 is a timing chart for illustrating an operation of a JK flip-flop of the phase comparator of FIG. 5.

FIG. 5 is a diagram for illustrating the configuration of an example of a phase comparator (namely, an amplifying circuit section) according to the related art to be used in the semiconductor integrated circuits of FIGS. 1 and 2. Further, FIG. 6 is a timing chart for illustrating an operation of a JK flip-flop of the phase comparator of FIG. 5.

As shown in FIG. 5, the amplifying section of the phase comparing circuit 31 has the JK flip-flop 427 and an amplifier 428 consisting of NAND gates and inverters. The output signal $\phi_a$ is input to the JK flip-flop 427 from the phase comparing section of FIGS. 10A and 10B. According to the signal level of the signal $\phi_a$, the electric potentials of nodes 7a-9 and 7a-11 alternately have the high level "H" and the low level "L". The amplifier 428 receives and amplifies an output signal of the JK flip-flip 427 and the signals $\phi_b$ and $\phi_d$ and then outputs the amplified signals.

First, an operation of the JK flip-flop 427 will be described hereinbelow with reference to the timing chart of FIG. 6.

When the signal level of the signal $\phi_a$ changes from the high level "H" to the low level "L" at a moment T1, the signal levels at nodes 7a-1 and 7a-10 change from the low level "L" to the high level "H". Signal levels at nodes 7a-5, 7a-6, and 7a-7 change in response to the change in signal level at the node 7a-1, whereas the signal level at a node 7a-8 does not change because of the low signal level "L" of the signal $\phi_a$. Consequently, the output (node) 7a-9 does not change, while only the signal level corresponding to the output (node) 7a-11 changes from the high level "H" to the low level "L". Next, at a moment T2, the signal level of the signal $\phi_a$ changes from the low level "L" to the high level "H", and then, the signal level at the node 7a-8 changes from the high level "T1" to the low level "L", in contrast with the operation at the moment T1. The signal level at the node 7a-10 does not change because the signal level at the node 7a-7 is unchanged. The signal level at the output node 7a-9 changes from the low level "L" to the high level "H", whereas the signal level at the output node 7a-11 is unchanged. In this manner, the signal levels at the output nodes 7a-9 and 7a-11 of the JK flip-flop 427 alternately change between the high level "H" to the low level "L", in response to the change in signal level of the signal $\phi_a$.

Figure 7:
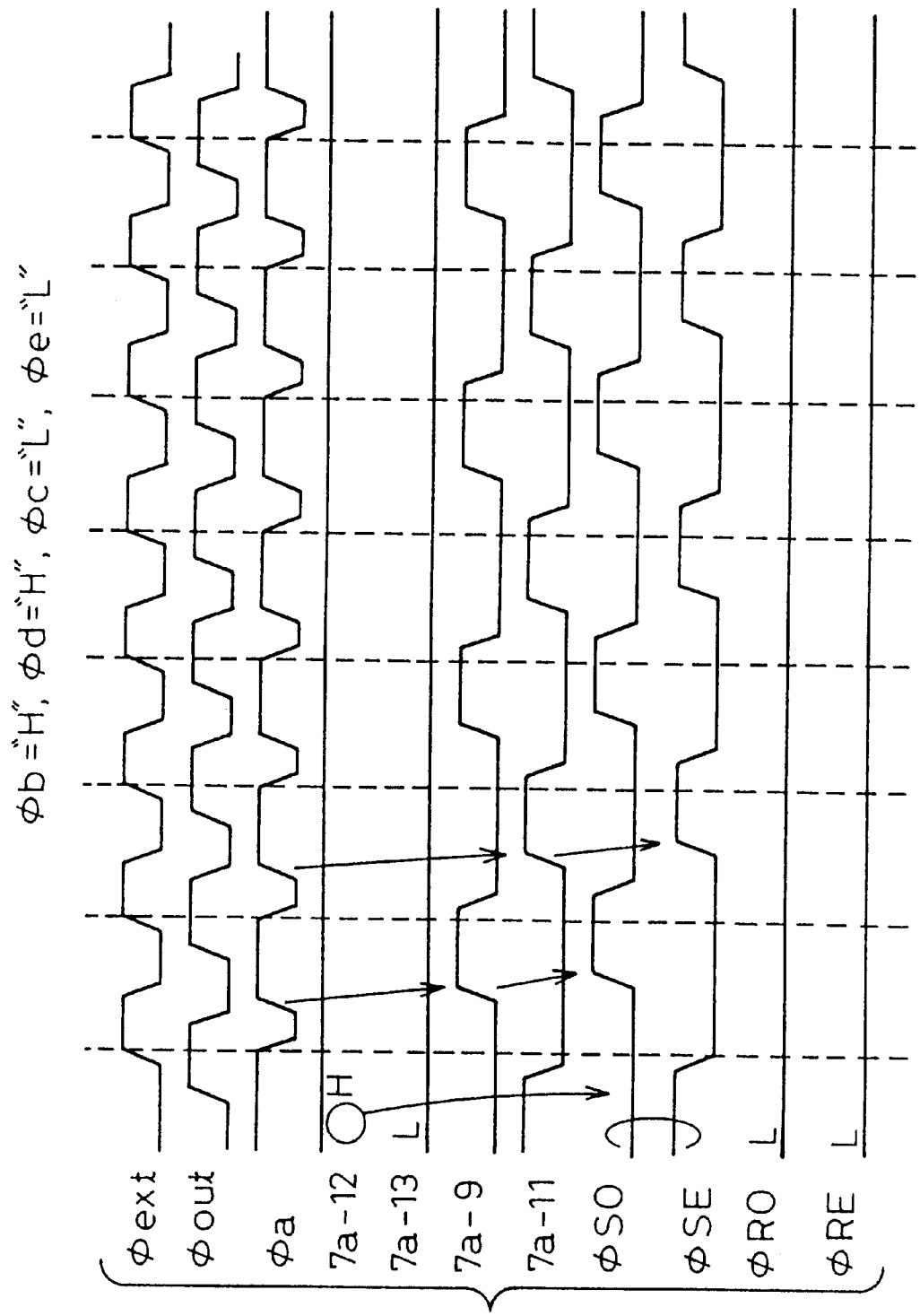
FIG. 7 is a timing chart for illustrating an operation of the amplifying circuit section provided in the phase comparator of FIG. 5 (when incrementing)
Figure 8:
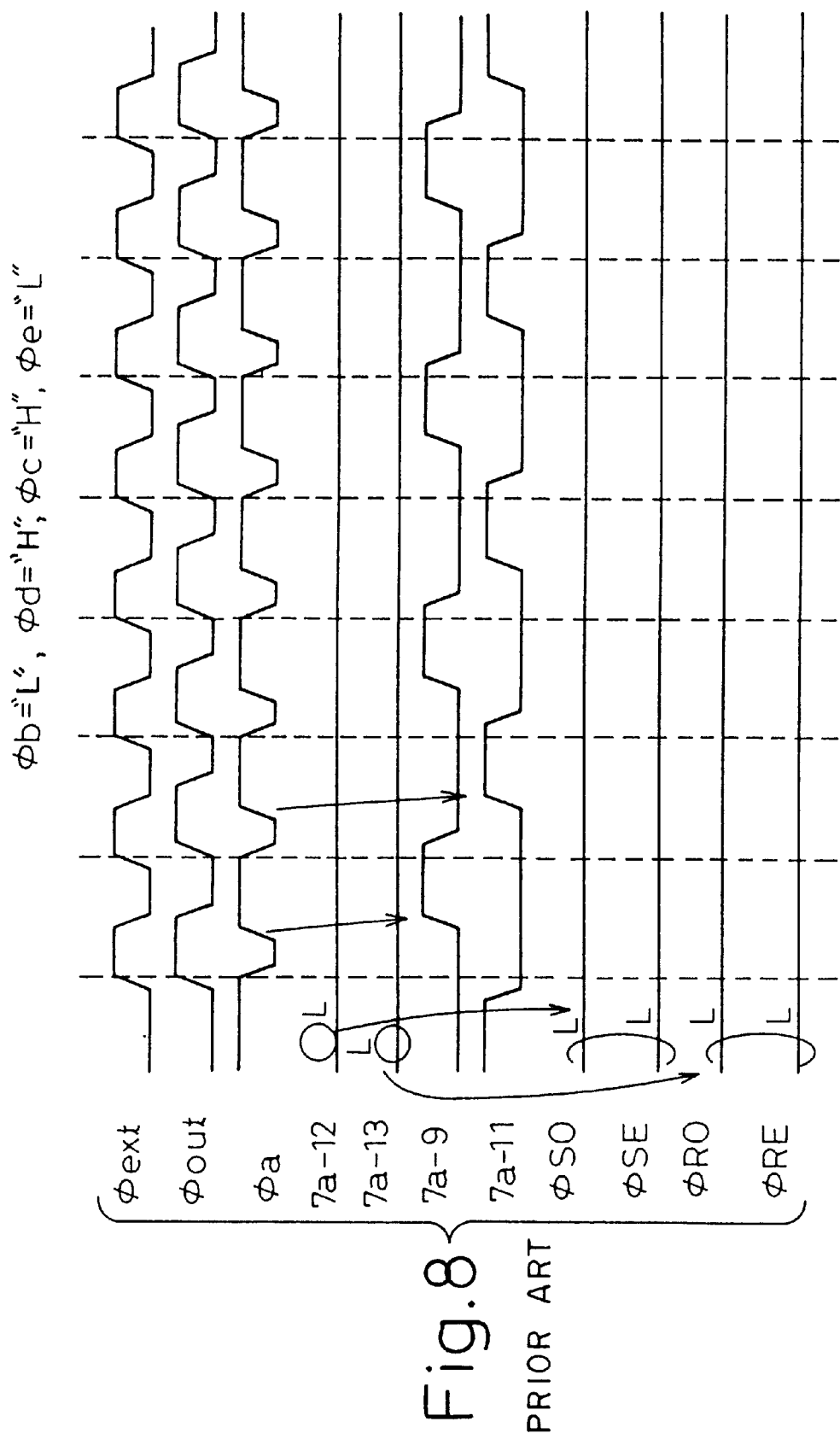
FIG. 8 is a timing chart for illustrating an operation of the amplifying circuit section provided in the phase comparator of FIG. 5 (when sustaining)
Figure 9:
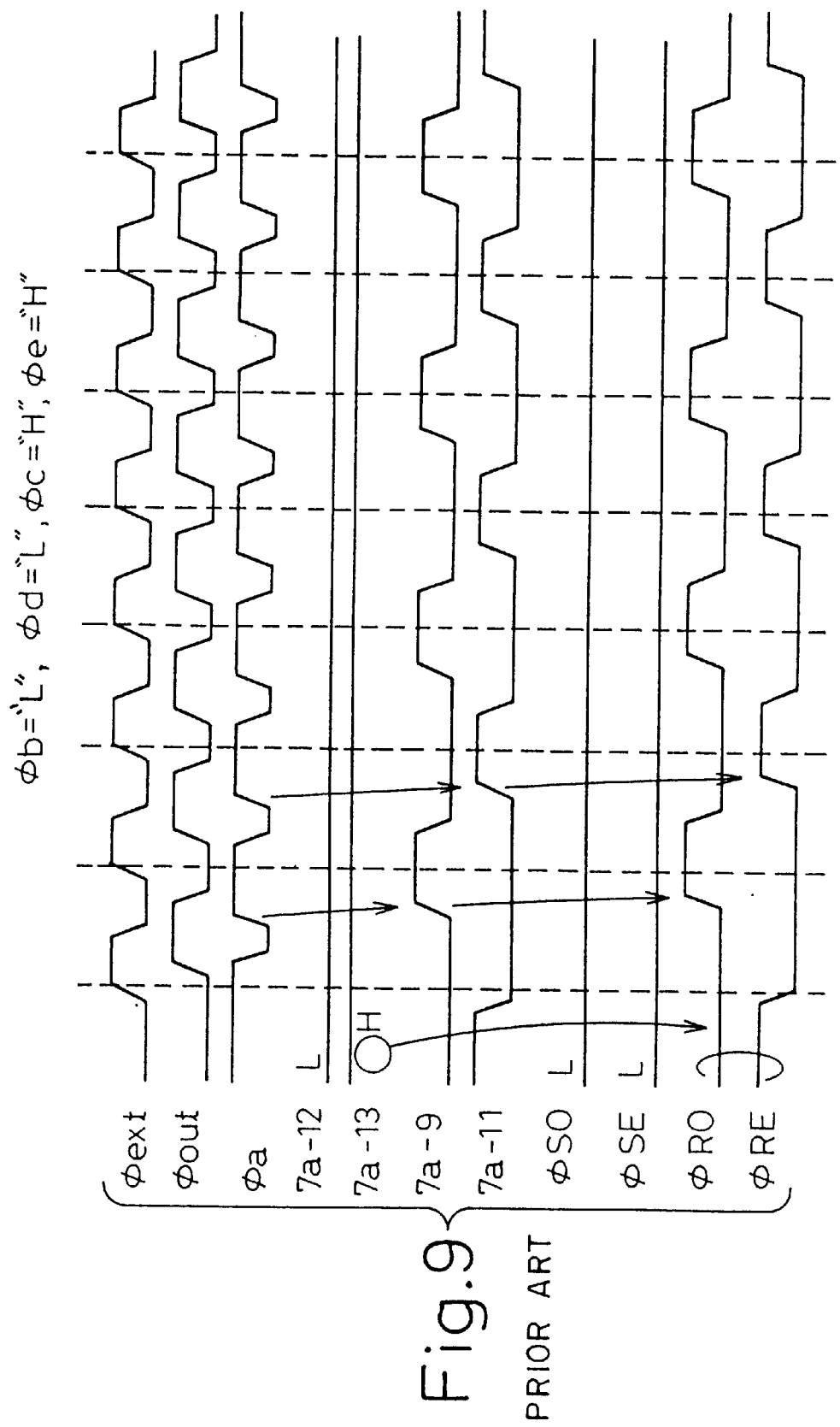
FIG. 9 is a timing chart for illustrating an operation of the amplifying circuit section provided in the phase comparator of FIG. 5 (when decrementing)

FIG. 7 is a timing chart for illustrating an operation of the amplifying section of FIG. 5 provided in the phase comparator, which is performed when incrementing. FIG. 8 is a timing chart for illustrating an operation thereof to be performed when sustaining. FIG. 9 is a timing chart for illustrating an operation thereof to be performed when decrementing. Next, an operation of the amplifying section 428 will be described hereinbelow with reference to FIGS. 7 to 9.

FIG. 7 illustrates the case that the signal level of the comparison object signal $\phi_{out}$ changes from the low level "L" to the high level "H" before a rise of the comparison reference signal $\phi_{ext}$. Input signals provided from the phase comparing section in this case are as follows. Namely, the signal $\phi_b$ is at the high signal level "H"; the signal $\phi_c$ at the low signal level "L"; the signal $\phi_d$ at the high signal level "H"; and the signal $\phi_e$ at the low signal level "L". Consequently, the signal levels at a node 7a-12 becomes the high level "H"; and the signal level at a node 7a-13 is fixed at the low level "L". Although set signals $\phi$SO and $\phi$SE change according to the state of the JK flip-flop 427, the reset signals $\phi$RO and $\phi$RE are unchanged because of the low signal level "L" of the node 7a-13.

FIG. 8 illustrates the case that the signal level of the comparison object signal $\phi_{out}$ changes from the low level "L" to the high level "H", substantially simultaneously with the comparison reference signal $\phi_{ext}$. Input signals provided from the phase comparing section in this case are as follows. Namely, the signal $\phi_b$ is at the low signal level "L"; the signal $\phi_c$ at the high level "H"; the signal $\phi_d$ at the high level "H"; and the signal $\phi_a$ at the low level "L". Consequently, the signal levels at the nodes 7a-12 and 7a-13 are fixed at the low level "L". The set signals $\phi$SO and $\phi$SE are not affected by the output of the JK flip-flop. Therefore, the signal levels of the signals $\phi$SO, $\phi$SE, $\phi$RO, and $\phi$RE remain fixed at the low level "L".

FIG. 9 illustrates the case that the comparison object signal $\phi_{out}$ changes from the low level "L" to the high level "H" behind the rise of the comparison reference signal $\phi_{ext}$. Input signals provided from the phase comparing section of FIG. 12 in this case are as follows. Namely, the signal level of the signal $\phi_b$ is at the low level "L"; that of the signal $\phi_c$ at the high level "H"; that of the signal $\phi_d$ at the low level "L"; and that of the signal $\phi_e$ at the high level "H". Consequently, the signal level at the node 7a-12 is fixed at the low level "L"; the signal level at the node 7a-13 is fixed at the high level "H"; the signal levels of the reset signals $\phi$RO and $\phi$RE change according to the state of the JK flip-flop; and the set signals $\phi$SO and $\phi$SE are unchanged because of the low signal level "L" of the node 7a-12.

As above-mentioned, for instance, in the case of the semiconductor integrated circuit illustrated in FIG. 2, the timing, at which a phase comparison is made by the phase comparator 31 of the DLL circuit 3, is determined by output signals (namely, the first output signal S2 and the second output signal S3) from the (frequency) divider circuit 30. For example, in the case that the divider circuit 30 divides the frequency of an input signal (S1) by 8 (for instance, similarly as in the case of the signal S3 of FIG. 14, a part of such a signal corresponding to two periods or cycles of the external clock (S1) has a first level, and another part of such a signal corresponding to six periods of the external clock has a second level), a phase comparison is made by the phase comparator 31 at the corresponding timing, namely, once every eight periods of the external clock S1 (CLK).

Therefore, in the case that an operation of controlling a delay amount of the delay circuit 33 (namely, the dummy delay circuit 34) through the delay controller 32, a delay amount corresponding to one delay stage is added thereto or subtracted therefrom once every eight periods of the external clock CLK. Therefore, in the case that there are large phase differences among signals (S3, S0, $\phi_{ext}$ (namely, the comparison reference signal) and $\phi_{out}$ (namely, the comparison object signal)) to be input to the phase comparator 31 at power-up and at power-on/reset and that thus, there is the necessity for providing a large delay amount to the circuit, only a delay amount corresponding to one delay stage is changed every eight periods of the external clock, so that a long time is required to lock up the DLL circuit 3.

Namely, to establish a time period in which both of the signals S3 and S0 to be input to the phase comparator 31 of the DLL circuit 3 have the high signal level "H", or to reduce the power consumption, there is the need to divide the frequency of an output signal (namely, a first output signal S2 and a second output signal S3) of the divider circuit 30 by a relatively large number (for example, eight or sixteen) and output resultant signals. Thus, the circuit according to the related art has encountered the problem that at power-up and so forth, it takes long time to lock up the DLL circuit.

Hereinafter, the preferred embodiments of the present invention, namely, phase comparators, DLL circuits and semiconductor integrated circuits embodying the present invention will be described by referring to the accompanying drawings.

FIGS. 10A and 10B are circuit diagrams showing an embodiment of a phase comparator (or phase comparing circuit (namely, a phase comparing section and an amplifying section)) provided in a semiconductor integrated circuit of the present invention. Note that this embodiment of the present invention, namely, the phase comparator illustrated in FIGS. 10A and 10B corresponds to the phase comparator provided with the aforementioned phase comparing section of FIG. 3 and the amplifying circuit section of FIG. 5 and can be applied to the phase comparator 31 of the semiconductor integrated circuit (namely, the DLL circuit 3) illustrated in FIG. 2 according to the related art without being modified. Incidentally, this embodiment of the present invention, namely, the phase comparator shown in FIGS. 10A and 10B can be applied to the semiconductor integrated circuit (namely, the DLL circuit 3) according to the related art as the phase comparator 31 thereof.

In FIGS. 10A and 10B, reference characters $\phi_{out}$ and $\phi_{ext}$ denote an output signal and an external clock signal to be compared with each other in this phase comparator, respectively. The phase of the signal (namely, a comparison object signal: In) $\phi_{out}$ to be compared is determined on the basis of a signal (namely, a comparison reference signal: Ref) $\phi_{ext}$. Further, reference characters $\phi_a$ to $\phi_e$ designate output signals to be connected to the amplifying circuit section, respectively.

As is obvious from a comparison between the phase comparator shown in FIGS. 10A and 10B and the aforementioned phase comparing section of the phase comparator of FIG. 3, the phase comparator 31 of this embodiment comprises: flip-flop circuits 421 and 422, each of which consists of two NAND gates; latch circuits 425 and 426 each for latching the state of a corresponding one of the flip-flop circuits 421 and 422; an activation signal generator 424 for generating activation signals used in the latches 425 and 426; and a delay circuit 423 for causing a time delay by one delay time unit (1 td) and for obtaining a phase tolerance for the external clock signal $\phi_{ext}$ (Ref). Note that "1 td" represents a delay time corresponding to one delay stage. Further, reference character 420 denotes a first phase comparing section.

Moreover, as is apparent from the comparison between the phase comparator shown in FIGS. 10A and 10B and the aforementioned amplifying circuit section of the phase comparator of FIG. 5, the phase comparator 31 of this embodiment is provided with: a JK flip-flop 427; and an amplifier 428 consisting of NAND gates and inverters. Further, in the case of the phase comparator of this embodiment of the present invention, the amplifying section 428 is different from the amplifying section illustrated in FIG. 5 in that a signal passing through a node 7a-12 is provided as an output of five stages of inverters connected in series and that similarly, a signal passing through a node 7a-13 is provided as an output of five stages of inverters connected in series. However, the fundamental composing elements of the amplifying section 428 of this embodiment is similar to those of the amplifying section of FIG. 5. Moreover, in the case of the phase comparator illustrated in FIGS. 10A and 10B, a signal $\phi_a$ to be supplied to the JK flip-flop 427 is different from the signal $\phi_a$ fed to the amplifying section shown in FIG. 5.

Furthermore, as shown in FIGS. 10A and 10B, the phase comparator 31 of this embodiment has: the flip-flop circuits 411 and 412, each of which consists of two NAND gates; latch circuits 415 and 416 each for latching the state of a corresponding one of the flip-flop circuits 411 and 412; a delay circuit 413 for causing a time delay by eight delay time units (8 td) and for obtaining a phase tolerance for the external clock signal $\phi_{ext}$ (Ref); and a delay circuit 414 for delaying a comparison object signal $\phi_{out}$ (In) by four delay time units (4 td). Note that the delay circuit 414 for providing a delay time "4 td" shifts the delay time "8 td" in the delay circuit 413 by an amount of "4 td", so that a phase tolerance of ±4 td (incidentally, the overall width of the range of the values of the phase tolerance is "8 td"), is obtained by the delay circuit 413. Additionally, reference numeral 410 denotes a second phase comparing section.

Further, the phase comparator 31 of this embodiment is provided with: an oscillator circuit 503 composed of a plurality of inverters and a plurality of NAND gates; a counter circuit 500 for counting output pulses of the aforesaid oscillator circuit; an oscillator controller (or control circuit) 504 for controlling an operation of the oscillator (circuit); and a signal selecting circuit 505 for selecting and controlling the signal $\phi_a$ to be supplied to the JK flip-flop 427. Incidentally, the counter circuit 500 comprises two stages of counters 501 and 502.

As is shown in FIGS. 10A and 10B, the phase comparator 31 of this embodiment can be applied to the semiconductor integrated circuit of FIG. 1 or 2 as the phase comparator 31 of the DLL circuit 3 thereof without any modification. The phase comparator 31 of this embodiment is adapted to phase-compare the leading edge of the comparison reference signal $\phi_{ext}$ with that of the comparison object signal $\phi_{out}$ and to control shift-operations (namely, operations of shifting to the right or left) of a shift register (namely, the delay controller (or control circuit) 32 (see FIG. 17)) in accordance with control signals φSO, φSE, φRO and φRE, which are supplied to the delay controller 32, to thereby adjust the delay amount of a delay caused by a delay stage (namely, the delay circuit 33 and the dummy delay circuit 34). Incidentally, φRE denotes an addition control signal for an even(-numbered) slage; φRO an addition control signal for an odd(-numbered) stage; φSE a subtraction control signal for an even(-numbered) stage; φSO a subtraction control signal for an odd(numbered) stage. Further, as will be described later, when the phase of the comparison object signal $\phi_{out}$ is ahead of the phase of the comparison reference signal $\phi_{ext}$, the addition control signal φRE for an even(-numbered) stage and/or the addition control signal φRO for an odd(-numbered) stage is output to the delay controller (32) to thereby increase the delay amount in the delay circuit (33) and the dummy delay circuit (34). Moreover, when the phase of the comparison object signal $\phi_{out}$ is behind the phase of the comparison reference signal $\phi_{ext}$, the subtraction control signal φSE for an even(-numbered) stage and/or the subtraction control signal φSO for an odd(-numbered) stage are output to the delay controller (32) to thereby decrease the delay amount in the delay circuit (33) and the dummy delay circuit (34).

At that time, in the case of the phase comparator of this embodiment, when the phase difference between the comparison reference signal $\phi_{ext}$ and the comparison object signal φ$_{out}$ is large, a plurality of pulses (namely, four pulses in the case of this embodiment) are output as control signals, and the delay amount can be largely corrected by performing shifts of data, which corresponds to a plurality of stages, in the shift register (namely, the delay controller 32). Additionally, a predetermined value used for comparing the phase of the comparison reference signal φ$_{ext}$ with that of the comparison object signal φ$_{out}$ is determined by using a delay amount (1 td) of one delay stage of the delay circuit (33) and the dummy delay circuit (34), which will be described later, as a (delay time) unit.

Hereunder, an operation of the phase comparator of this embodiment will be described.

In the circuit illustrated in FIGS. 10A and 10B, the first phase comparing section 420 phase-compares the comparison object signal φ$_{out}$ (In) with the comparison reference signal φ$_{ext}$ within a range between +1 td and −1 td. Incidentally, "1 td" designates a delay time corresponding to one delay stage (namely, one delay element) used in the delay circuit 33 and the dummy delay circuit 34 (see FIGS. 16A to 16C), namely, designates a delay amount corresponding to one delay stage.

Namely, the first phase comparing section 420 is adapted to judge the condition of the comparison object signal according to the phase difference "tdp" between the comparison object signal φ$_{out}$ and the comparison reference signal φ$_{ext}$ (that is, the phase of the comparison object signal φ$_{out}$ relative to the phase of the comparison reference signal φ$_{ext}$:tdp=φ$_{out}$−φ$_{ext}$) as follows. If tdp>0, the condition of the comparison object signal is judged as being "SLOW". If 0≧tdp≧−1 td, the condition of the comparison object signal is judged as being "JUST". Further, if −1 td>tdp, the object signal is judged as being "FAST".

Similarly, the second phase comparing section 410 is adapted to phase-compare the comparison object signal φ$_{out}$ with the comparison reference signal φ$_{ext}$ within a range between +4 td and −4 td. Further, if the phase difference "tdp" between the comparison object signal φ$_{out}$ and the comparison reference signal φ$_{ext}$>4 td, the condition of the comparison object signal is judged as being "SLOW" (corresponding to "VERY SLOW"). If 4 td≧tdp≧−4 td, the condition of the comparison object signal is judged as being "JUST". Further, if −4 td>tdp, the object signal is judged as being "FAST" (corresponding to "VERY FAST").

Further, if the second phase comparing section 410 judges the condition of the comparison object signal as being "SLOW" (or "VERY SLOW") or "FAST" (or "VERY FAST"), the signal levels of signals N00 and N01, which are output signals of the latch circuits 415 arid 416, or signals N10 and N11 are changed into the high level "H", so that pulses having low signal levels "L" are output as a signal "Start" in the oscillator control circuit 504. Thus, the signal level of an oscillator activation (or enabling) signal "OscEn" is changed to the high level "H". Consequently, the counter circuit 500 and the oscillator circuit 503 are activated (in an enabling condition).

Counter circuit 500 is operative to count signals oscillated by the oscillator circuit 503. When the signal level of the oscillator enable signal OscEn is changed into the high level "H", the oscillator circuit 503 oscillates. The counter circuit 500 counts signals (pulses) oscillated by oscillator circuit 503. When reaching a predetermined count, a signal having the low level "L" is output on a signal line "Stop" in an oscillator control circuit 504, so that the signal level of the oscillator enabling signal "OscEn" is changed to the low level "L". Thereby, the oscillator circuit 503 stops the oscillation, and the counter circuit 500 is put into a reset state (in which the count is returned to 0).

Note that the predetermined number of signals (or pulses) oscillated by the oscillator circuit 503, namely, the count thereof, at which the oscillation of the aforesaid oscillator circuit is stopped, can be set at a given number by a composing element of the counter. circuit 500. Incidentally, the counter circuit 500, the oscillator circuit 503 and the oscillator control circuit 504 (and the signal selecting circuit 505) compose a pulse number control section for controlling the number of pulses output according to a result of a phase comparison made in the phase comparing sections (namely, the first phase comparing section 420 and the second phase comparing section 410).

Further, in this embodiment illustrated in FIGS. 10A and 10B, when the second phase comparing section 410 judges the conditions of the comparison object signal as being "SLOW" (or "VERY SLOW") or "FAST" (or "VERY FAST"), one pulse is output in a step of making a phase comparison between the comparison object signal φ$_{out}$ and the comparison reference signal φ$_{ext}$. Furthermore, three pulses are output in response to the oscillation of the oscillator circuit 503. Consequently, these four pulse signals are output, so that the correction of a delay amount corresponding to "4 td" is achieved.

Namely, the oscillator circuit 503 is adapted so that when both of the signal levels at nodes n100 and n101 in the counter circuit 500 become the high level "H", the oscillation of the circuit 503 is stopped. Incidentally, the nodes n100 and n101 correspond to a first bit and a second bit of a binary number, respectively. Therefore, the case in which both of the signal levels at the nodes n100 and n101 are the high level "H", the number corresponds to decimal "3".

Moreover, the output pulses are put together into a signal Pu(φ$_a$) by the signal selecting circuit 505. Then, the signal Pu(φ$_a$) is supplied to the JK flip-flop 427. When shifts are performed in the register, it is necessary for the shift register (namely, the delay controller 32) to control the even-numbered registers and the odd-numbered registers by distinguishing therebetween. Therefore, the JK flip-flop 427 stores information representing whether the register, in which a shift is performed last, is an even-numbered or odd-numbered one. Furthermore, when a result of a phase comparison is output as data indicating an addition or subtraction to be performed on the delay amount, the JK flip-flop 427 outputs a selection signal for selecting an even-numbered stage or an odd-numbered stage. Namely, each time a pulse is input onto the signal line Pu, an output of the JK flip-flop 427 is changed from an output for an even-numbered stage (namely, the control signals φSE and φRE) to an output for an odd-numbered stage (namely, the control signals φSO and φRO) or, alternatively, from an output for an odd-numbered stage (namely, the control signals φSO and φRO) to an output for an even-numbered stage (namely, the control signals φSE and φRE).

Further, when the first phase comparing section 420 judges that the condition of the comparison object signal is "SLOW" or "FAST", a pulse is output once to the signal lines for the control signals φSO and φRO or to the signal lines for the control signals φSE and φRE. Moreover, when the second phase comparing section 410 judges that the condition of the comparison object signal is "SLOW" (or "VERY SLOW") or "FAST" (or "VERY FAST"), a pulse is output four times to the signal lines for the control signals φSO and φRO or to the signal lines for the control signals φSE and φRE according to the result (namely, "SLOW" or "FAST") of the judgement made by the first phase comparing section 420 (incidentally, when the second phase comparing section 410 judges that the condition of the comparison object signal is "SLOW" or "FAST", the result (namely, "SLOW" or "FAST") of the judgement made by the first phase comparing section is inevitably in agreement with the result (namely, "SLOW" or "FAST") of the judgement made by the aforesaid second phase comparing section 410).

Therefore, according to both of the results of the judgements made by the first phase comparing section 420 and the second phase comparing section 410, pulses are output on the basis of the phase difference tdp between the comparison object signal $\phi_{out}$ and the comparison reference signal $\phi_{ext}$ (namely, the phase of the comparison object signal $\phi_{out}$ relative to the phase of the comparison reference signal $\phi_{ext}$:tdp=$\phi_{oout}$-$\phi_{ext}$) as follows. Namely, if tdp>4 td, the condition of the comparison object signal is judged as being "VERY SLOW". Thus, a pulse is output four times in all to the signal lines for the control signals φSO and φSE. Further, if 4 td≧tdp >0, the condition of the comparison object signal is judged as being "SLOW". Thus, a pulse is output one time to the signal line for the control signal φSO or φSE. Moreover, if 0≧tdp≧–1 td, the condition of the comparison object signal is judged as being "JUST". Thus, no pulse is output to the signal lines for the control signals φRO, φRE, φSO and φSE (by maintaining the current delay amount). Furthermore, if –1 td>tdp ≧–4 td, the condition of the comparison object signal is judged as being "FAST". Thus, a pulse is output one time to the signal line for the control signal φRO or φRE. Additionally, if –4 td>tdp, the condition of the comparison object signal is judged as being "VERY FAST". Thus, a pulse is output four times in all to the signal lines for the control signals φRO and φRE.

Thus, the phase comparing section 31 is provided with: a first phase comparing section 420 for making a judgement by comparing the phase difference tpd between the comparison object signal $\phi_{out}$ and the comparison reference signal $\phi_{ext}$ with a delay amount mtd (for example, 1 td) corresponding to m stages; and a second phase comparing section 410 for making a judgement by comparing the phase difference tpd between the comparison object signal $\phi_{out}$ and the comparison reference signal $\phi_{ext}$ with a delay amount ntd (for instance, 4 td) corresponding to n stages (incidentally, m and n are different natural numbers and m<n). Thus, the number of pulses output by the pulse number control section is controlled according to results of judgements made by these first and second phase comparing sections 420 and 410.

Note that the number of pulses output in the case where results of judgments are "VERY FAST" and "VERY SLOW" is not limited to four and that the number of such pulses may be set at, for example, eight. In this case, for instance, the counter circuit 500 is constituted as a three-stage counter obtained by adding an additional one stage counter (which is similar to the counter 501 or 502) to the two stages of counters 501 and 502. Alternatively, the number of pulses output in the case of "VERY FAST" and "VERY SLOW" is changed into 3 by extracting an output signal from a node N2 instead of the node n101 in the counter circuit 500. In this case, the number of output pulses may be set by performing a trimming operation on a manufactured semiconductor integrated circuit (namely, a DLL circuit) according to the characteristics thereof. Namely, the number of output pulses may be set at three or four by cutting a predetermined line or wire on a chip, on which the circuit is formed. Furthermore, the circuit illustrated in FIGS. 10A and 10B is an example of a phase comparator. Needless to say, this circuit may be modified in various ways.

Incidentally, in the case that the comparison (or judgement) in the first phase comparing section 420 is performed within a range between –1 td and +1 td, the delay amount of the delay circuit 423 is set at a value between 1 td and 2 td, and the comparison object signal $\phi_{out}$ has only to be supplied to the circuit through a delay circuit having a delay amount of 1 td. At that time, the first phase comparing section 420 makes the judgment on the basis of the phase difference tdp between the comparison object signal $\phi_{out}$ and the comparison reference signal $\phi_{ext}$ (namely, the phase of the comparison object signal $\phi_{out}$ relative to the phase of the comparison reference signal $\phi_{ext}$:tdp=$\phi_{out}$-$\phi_{ext}$) as follows. Namely, if –1 td>tdp, the condition of the comparison object signal is judged as being "FAST". Further, if 1 td≧tdp≧–1 td, the condition of the comparison object signal is judged as being "JUST". Moreover, if tdp≧1 td, the condition of the comparison object signal is judged as being "SLOW".

FIGS. 11A to 11E are diagrams illustrating results of simulation of the phase comparator shown in FIGS. 10A and 10B, respectively. FIG. 11A shows the waveform at the time when the result of the judgement is "VERY FAST"; FIG. 11B the waveform at the time when the result of the judgement is "FAST"; FIG. 11C shows the waveform at the time when the result of the judgement is "JUST"; FIG. 11D the waveform at the time when the result of the judgement is "SLOW"; and FIG. 11E the waveform at the time when the result of the judgement is "VERY SLOW". Incidentally, in the following description, an explanation will be given on condition that the phase of the comparison object signal $\phi_{out}$ relative to the phase of the comparison reference signal $\phi_{ext}$:tdp=$\phi_{out}$-$\phi_{ext}$.

First, when the phase of the comparison object signal $\phi_{out}$ (In) is far ahead of the phase of the comparison reference signal $\phi_{ext}$ (Ref) as illustrated in FIG. 11A (namely, –4 td>tdp), the result of the judgment is "VERY FAST", and a pulse is output twice to the signal lines corresponding to the control signals φRO and φRE, respectively and alternately (thus a pulse is output thereto four times in all), at the time of making a phase comparison. Note that a delay amount corresponding to one delay stage (namely, a delay time caused by a single delay element or device) is 60 psec. (that is, 0.06 nsec.) and that the same goes for figures showing results of the simulation, respectively. Thereby, a signal in which an additional delay time corresponding to four delay elements (namely, a delay amount corresponding to four delay stages) is caused, namely, a signal further delayed by a delay time corresponding to four delay elements is output from each of the delay circuit 33 and the dummy delay circuit 34. Incidentally, in the case of the simulation illustrated in FIG. 11A (see a partially enlarged view), initially (for instance, at power-up), the phase of the comparison object signal $\phi_{out}$ is ahead of the phase of Lhe comparison reference signal $\phi_{ext}$ by 20 td (incidentally, tdp=–1.2 nsec.). This figure illustrates the manner that a set of two control signals φRO are output five times (namely, four pulse signals φRO and φRE are output five times) and a set of two control signals φRE are output five times and that the circuit is put into the "JUST" condition (namely, 0≧tdp≧–1 td). Needless to say, between those respectively corresponding to "VERY FAST" and "JUST", there is the condition of the comparison object signal $\phi_{out}$ which may be judged as being "FAST" (incidentally, –1 td>tdp>–4 td). Moreover, in the case of this condition, an operation illustrated in FIG. 11B may be performed. Incidentally, the same goes for the case where the result of the judgment is "VERY SLOW".

Furthermore, in the case that the phase of the comparison object signal $\phi_{out}$ is ahead of the phase of the comparison reference signal $\phi_{ext}$ by a delay amount, which is larger than 1 td and is not more than 4 td (namely, $-1\ td > tdp \geq -4\ td$) as illustrated in FIG. 11B, the condition is judged as being "FAST", so that a pulse is output once to the signal line for the control signal $\phi RO$ or $\phi RE$. Thereby, a signal in which an additional delay time corresponding to one delay element (namely, a delay amount corresponding to one delay stage) is caused, namely, a signal further delayed by a delay time corresponding to one delay element is output from each of the delay circuit 33 and the dummy delay circuit 34. Incidentally, in the case of the simulation illustrated in FIG. 11B (see a partially enlarged view), initially, the phase of the comparison object signal $\phi_{out}$ is ahead of the phase of the comparison reference signal $\phi_{ext}$ by about 3.3 td (incidentally, $tdp=-0.2$ nsec.). This figure illustrates the manner that five sets of two control signals $\phi RO$ are output (i.e., $\phi RO=1,3$) and (i.e., $\phi RE=2,4$) five sets of two control signals $\phi RE$ are output five times and that the circuit is put into the "JUST" condition (namely, $0 \geq tdp \geq 1$ td).

In addition, in the case that the phase of the comparison object signal $\phi_{out}$ is ahead of the phase of the comparison reference signal $\phi_{ext}$ by a delay amount, which is not more than 1 td (namely, $0 \geq tdp \geq -1$ td) as illustrated in FIG. 11C, the condition is judged as being "JUST", so that no pulse is output to the signal lines for the control signals $\phi RO$, $\phi RE$, $\phi SO$ and $\phi SE$. Namely, the delay amounts in the delay circuit 33 and the dummy delay circuit 34 are maintained. Further, a signal, to which the same delay amount as maintained till then is applied, is output therefrom. Incidentally, in the case of the simulation illustrated in FIG. 11C (see a partially enlarged view), initially, the phase of the comparison object signal $\phi_{out}$ is ahead of the phase of the comparison reference signal $\phi_{ext}$ by about 0.3 td (incidentally, $tdp=-0.2$ nsec.).

Further, in the case that the phase of the comparison object signal $\phi_{out}$ is behind the phase of the comparison reference signal $\phi_{ext}$ by a delay amount, which is larger than 1 td and is not more than 4 td (namely, $4 td \geq tdp > 0$) as illustrated in FIG. 11D, the condition is judged as being "SLOW", so that a pulse is output once to the signal line for the control signal $\phi SO$ or $\phi SE$. Thereby, a signal in which a delay time corresponding to one delay element (namely, a delay amount corresponding to one delay stage) is subtracted from the delay amount, namely, a signal, whose delay amount is reduced by a delay time corresponding to one delay element, is output from each of the delay circuit 33 and the dummy delay circuit 34. Incidentally, in the case of the simulation illustrated in FIG. 11D (see a partially enlarged view), initially, the phase of the comparison object signal $\phi_{out}$ is behind the phase of the comparison reference signal $\phi_{ext}$ by about 2.5 td (incidentally, $tdp=+0.15$ nsec.). This figure illustrates the manner that a control signal $\phi SO$ is output once and a control signal $\phi SE$ is output once and that the circuit is put into the "JUST" condition (namely, $0 \geq tdp \geq -1 td$).

Moreover, in the case that the phase of the comparison object signal $\phi_{out}$ is far behind the phase of the comparison reference signal $\phi_{ext}$ as illustrated in FIG. 11E (namely, $-4\ td > tdp$), the result of the judgment is "VERY SLOW", arid a pulse is output twice to the signal lines corresponding to the control signals $\phi SO$ arid $\phi SE$, respectively and alternately (thus a pulse is output thereto four times in all), at the time of making a phase comparison. Thereby, a signal in which a delay time corresponding to four delay elements (namely, a delay amount corresponding to four delay stages) is subtracted from the delay amount, namely, a signal, whose delay amount is reduced by a delay time corresponding to four delay elements, is output from each of the delay circuit 33 and the dummy delay circuit 34. Incidentally, in the case of the simulation illustrated in FIG. 11E (see a partially enlarged view), initially (for instance, at power-up), the phase of the comparison object signal $\phi_{out}$ is behind the phase of the comparison reference signal $\phi_{ext}$ by 20 td (incidentally, $tdp=+1.2$ nsec.).

In the embodiment described hereinabove, the number of pulses output in the case of the conditions "VERY FAST" and "VERY SLOW" is not limited to four but may be changed to various values. Further, a value used for making a judgement on the basis of the phase difference tpd between the comparison object signal $\phi_{out}$ and the comparison reference signal $\phi_{ext}$ is not limited to 1 td, 0 and $\pm 4$ td.

FIGS. 12A and 12B are diagrams for illustrating timing provided in the phase comparator shown in FIGS. 10A and 10B. FIG. 12A corresponds to a signal input to the phase comparator provided in the semiconductor integrated circuit of FIG. 1. Further, FIG. 12B corresponds to a signal input to the phase comparator 3 provided in the semiconductor integrated circuit of FIG. 2. Note that one period or cycle of the external clock (S1: the comparison reference signal $\phi_{ext}$) $tCLK=4$ nsec., and that the difference between the signals (namely, the comparison reference signal $\phi_{ext}$ (S1) and the comparison object signal $\phi_{out}$ (S0)) to be input to the phase comparator is set at 5 nsec. Incidentally, FIG. 12B corresponds to FIG. 14 (to be described later).

As shown in FIG. 12A, in the case that no frequency division is performed, the leading edge of the comparison reference signal $\phi_{ext}$ should be adjusted to a position or phase Tb. However, when one period or cycle tCLK is lengthened, the leading edge of the signal $\phi_{ext}$ may be adjusted to a position Ta. Namely, it should be controlled according to the relation between the delay of the comparison object signal $\phi_{out}$ from the comparison reference signal $\phi_{ext}$ and the length of one period tCLK which of the positions Ta, Tb, Tc, Td, . . . is selected. This control operation, however, is attended with difficulties. Incidentally, in the phase comparator, first, the signal levels of input signals to be compared with each other become the low level "L". This is the reset state thereof. Subsequently, the signal level of one of the input signals becomes the high level "H" before that of the other of the input signals does. However, when returning to the reset state, the phase comparator should pass through a state in which both of the input signals have the high signal level "H". Namely, the phase comparison between the clock signals to be compared with each other (that is, the comparison reference signal $\phi_{ext}$ and the comparison object signal $\phi_{out}$) cannot be performed unless the signal levels of pulses of the signals $\phi_{ext}$ and $\phi_{out}$ are simultaneously higher than the low level "L".

However, in the case that it is preliminarily known that the time delay between the signals $\phi_{ext}$ and $\phi_{out}$ is 5 nsec at most and that the minimum length of one period or cycle tCLK is 4 nsec., the pulses of the signals $\phi_{ext}$ and $\phi_{out}$ are made to necessarily have the high level "H" at the same time (incidentally, this is important from the viewpoint of the characteristics of the phase comparator) by dividing the frequency of the external clock S1 (namely, $\phi_{ext}$) by eight and setting the duty ratio of the pulse at 1:3 as shown in FIG. 12B. Thus, a leading edge of the comparison object signal $\phi_{out}$ corresponding to a leading edge of the comparison reference signal is determined uniquely.

Figure 13:
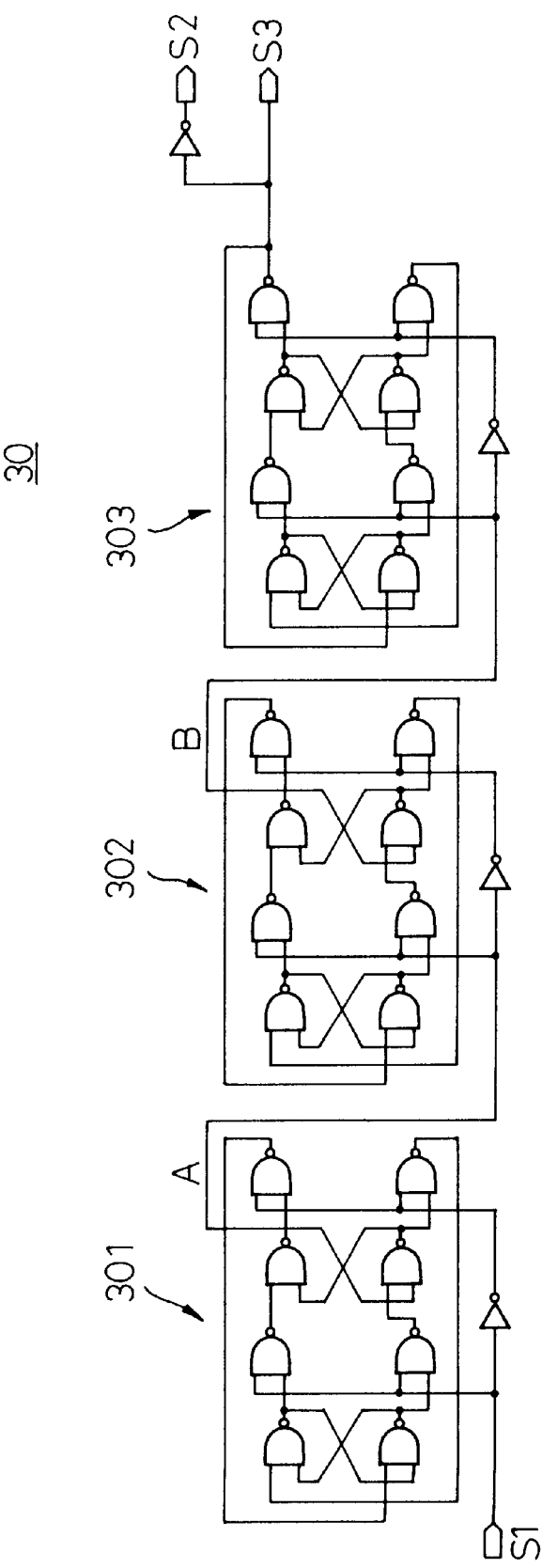
FIG. 13 is a circuit diagram showing an example of a (frequency) divider circuit provided in the semiconductor integrated circuit of FIG. 2.
Figure 14:
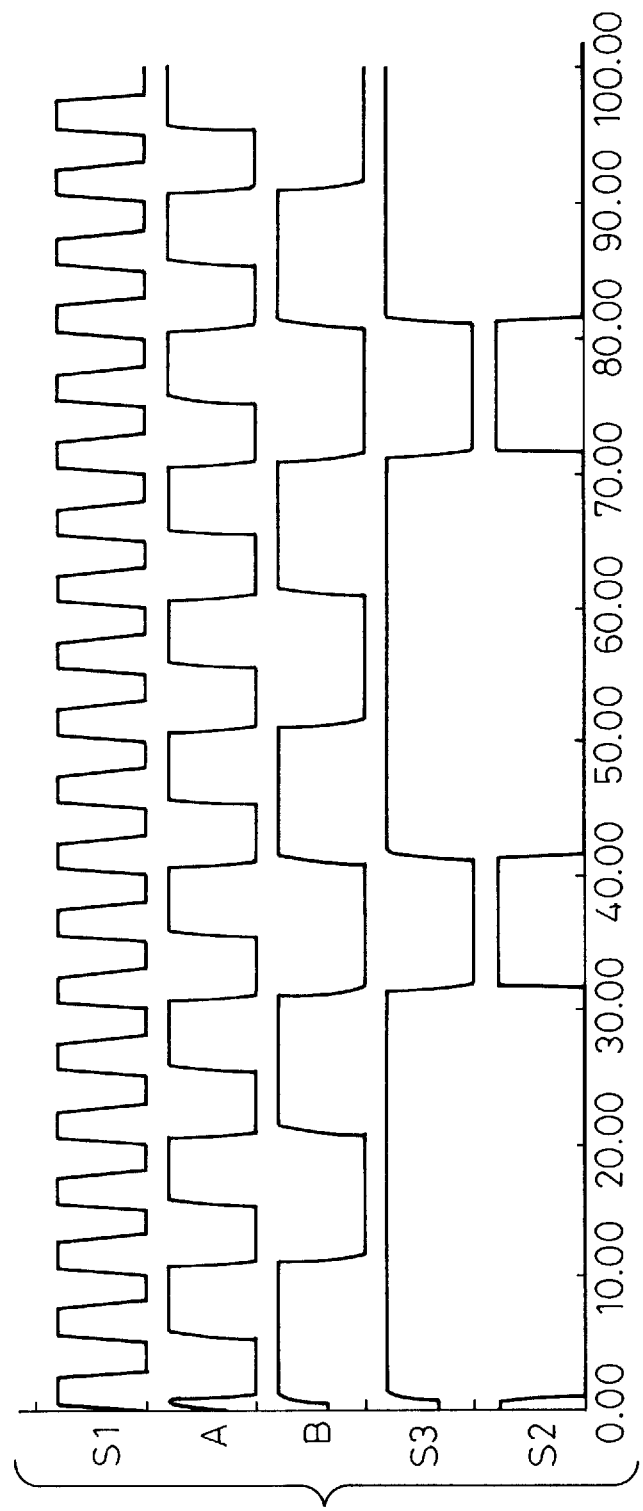
FIG. 14 is a diagram showing waveforms of signals respectively flowing through nodes of the divider circuit of FIG. 13.

FIG. 13 is a circuit diagram showing an example of a (frequency) divider circuit provided in the semiconductor integrated circuit of FIG. 2. FIG. 14 is a diagram showing waveforms of signals respectively flowing through nodes of the divider circuit of FIG. 13. Incidentally, as is obvious from the waveform diagram of FIG. 14, the divider circuit 30 shown in FIG. 13 is operative to divide the frequency of the input signal S1 (namely, the external clock CLK) by eight and to generate a signal S2 (or a signal S3) having the high level "H" (or the low level "L") during a part, which corresponds to two clock cycles of the external clock CLK, of the period or duration thereof and also having the low level "L" (or the high level "H") during a part, which corresponds to six clock cycles of the external clock CLK, of the period thereof.

As is illustrated in FIG. 13, the divider circuit 30 is constituted by three stages of counters 301 to 303 each consisting of a plurality of NAND gates and an inverter, and the signal S1 (namely, the external clock CLK passing through the input circuit 21) is supplied to the divider circuit 30 and the first and second output signals S2 and S3 as illustrated in FIG. 14 are generated therefrom. Incidentally, in FIG. 14, reference character A denotes an output signal of a first counter 301; and B an output signal of a second counter 302. Further, the divider circuit 30 is not limited to the circuit constituted by three stages of counters each consisting of a plurality of NAND gates and an inverter. Needless to say, the divider circuit 30 can be constituted by a combination of various logic gates.

Figure 15:
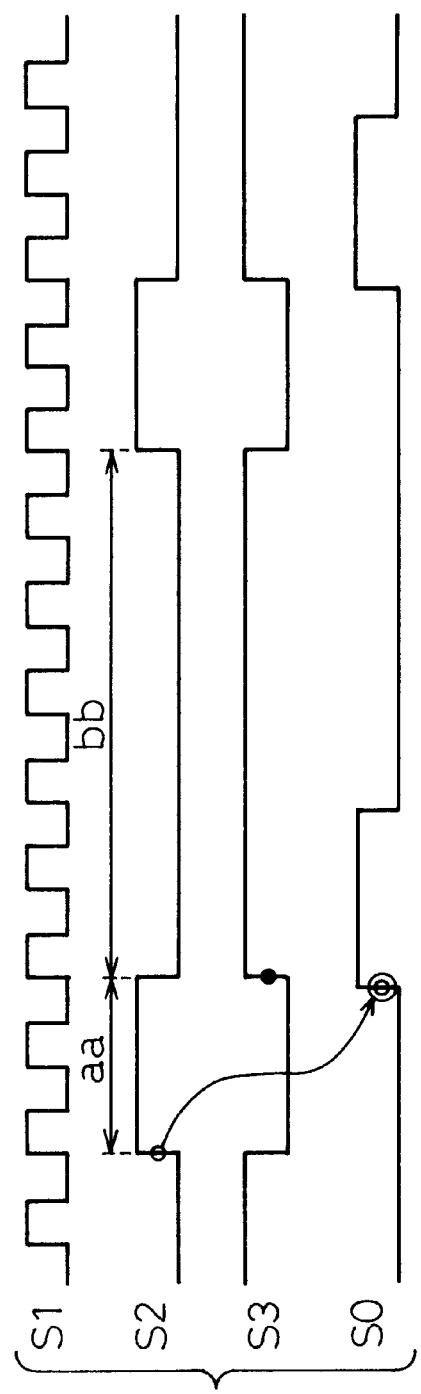
FIG. 15 is a timing chart for illustrating an operation of a semiconductor integrated circuit using the divider circuit of FIG. 13.

FIG. 15 is a timing chart for illustrating an operation of the semiconductor integrated circuit using the divider circuit of FIG. 13.

As shown in FIG. 15, the divider circuit 30 receives the signal S1 (namely, the external clock CLK) which is the output signal of the input circuit 21, and outputs a signal S2 (namely, the first output signal), whose frequency is divided by eight and whose period or cycle is a sum of periods aa+bb (to be described later), and a signal S3 (namely, the second output signal) which is a negative or opposite phase signal of the signal S2. Note that, in the signal S2, a period corresponding to two clock cycles of the external clock CLK (namely, the period aa in FIG. 15) is at the high level "H", and a period corresponding to six clock cycles of the external clock CLK (namely, the period bb in FIG. 15) is at the low level "L". The first output signal S2 of the divider circuit 30 is supplied to the dummy delay circuit 34, and the second output signal S3 of the divider circuit 30 is supplied to an input terminal of the phase comparator 31. Note that the signal S0, which is supplied to another input terminal of the phase comparator 31, is a signal obtained by delaying the first output signal S2 by means of the dummy delay circuit 34, the dummy line 4, the dummy output circuit 52 and the dummy input circuit 22.

The phase comparator (namely, a digital phase comparator) 31 compares the phase of the second output signal S3 of the divider circuit 30 at the rise thereof with the phase of the signal S0 at the rise thereof. The delay controller (namely, the shift register) 32 controls to apply the same delay to the delay circuit 33 and the dummy delay circuit 34 in accordance with the comparison result of the phase comparator 31. Namely, the DLL circuit 3 outputs an internal clock signal which is a signal corresponding to the signal Si output from the input, circuit 21 having a delay caused by the delay circuit 33. Therefore, in the DLL circuit 3, a phase-synchronized internal clock can be generated from the external clock signal CLK which precedes by two clock cycles, and thereby the DLL circuit 3 can be applied to a high-speed operable SDRAM.

In the herein-above-mentioned embodiment, the number of clock cycles, by which the external clock signal CLK used for generating the internal clock signal in the DLL circuit 3 precedes the current external clock signal, can be regulated by changing the period aa of the first output signal S2 of the divider circuit 30. By practically setting the length of the period aa of the signal S2 at the length of three clock cycles of the external clock CLK, the DLL circuit 3 can generate a phase-synchronized internal clock from the external clock signal CLK that precedes the current external clock signal by three clock cycles. Further, when changing the length of the period bb (thus, changing the length of (the period aa+the period bb)) of the first output signal S2 of the divider circuit 30, the interval, at which phase comparisons are made, can be changed.

Therefore, in the present embodiment, the divider circuit 30 is adapted to generate the first signal S2 whose signal level is at the high level "H" during a time having a length which is Y times the period or clock cycle of the signal S1 (namely, the external clock signal CLK) and is at the low level "L" during a time having a length which is Z times the period of the signal S1 (incidentally, Y denotes an integer which is not less than two; and Z an integer), and the phase comparison process or operation of the phase comparator 31 is performed by using the first and second output signals S2 and S3 at a timing obtained by delaying a time having a length which is Y times the period of the signal S1. Further, in the present embodiment, the divider circuit 30 is adapted to generate the first and second signals S2 and S3 by dividing the frequency of the signal S1 (namely, the external clock CLK) by X (incidentally, X denotes an integer which is not less than two), and the phase comparison process or operation of the phase comparator 31 is performed every time period whose length is X times the period (or clock cycle) of the external clock CLK.

Figure 16A:
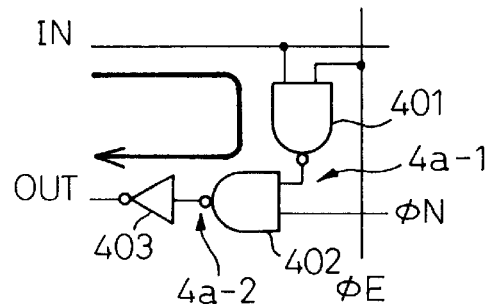
FIGS. 16A, 16B and 16C are diagrams for illustrating the configurations of examples of the delay circuits provided in the semiconductor integrated circuits of FIGS. 1 and 2, respectively.
Figure 16B:
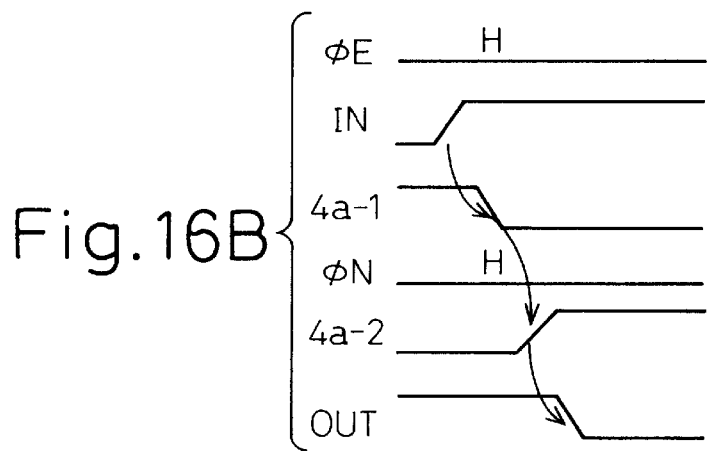
Figure 16C:
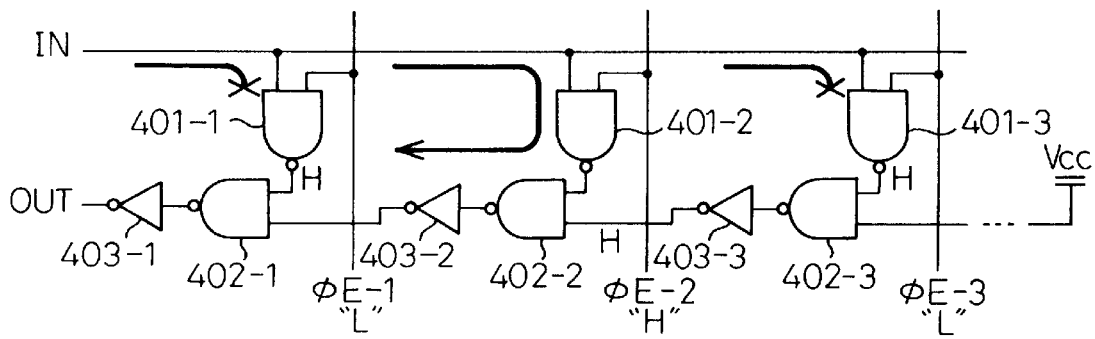

FIGS. 16A to 16C are diagrams for illustrating the configurations of examples of the delay circuits 33 and 34 provided in the semiconductor integrated circuits of FIGS. 1 and 2, respectively. FIG. 16A shows a one-bit delay circuit or element; FIG. 16B is a time chart illustrating an operation of this one-bit delay circuit; and FIG. 16C illustrates the configuration and operation of a plurality of stages of one-bit delay circuits or elements.

As shown in FIG. 16A, the one-bit delay element has two NAND gates 401 and 402 and an inverter 403. An operation of this one-bit delay element will be described hereinbelow by referring to FIG. 16B. An input signal $\phi E$ is an activation signal (namely, an enable signal). When the signal level of this signal is the high level "H", the delay circuit operates. FIG. 16B illustrates the state of the delay circuit, in which the signal level of the enable signal $\phi E$ is the high level "H", and to which a signal comes to be able to get an access. Incidentally, in FIG. 16B, reference character "IN" designates an input signal to a one-bit delay circuit or element; $\phi N$ an output signal of an adjacent one-bit delay circuit of FIG. 16A provided on the right side as viewed in this figure; OUT an output signal of a one-bit delay circuit or element; and 4a-1 and 4a-2 waveforms of signals at corresponding nodes of the circuit shown in FIG. 16A. Therefore, the output signal OUT corresponds to a signal $\phi N$ to another adjacent one-bit delay circuit provided on the left side of this figure.

When the signal $\phi N$ is at the low level "L", the output signal OUT always has the low signal level "L". Further, if the signal $\phi N$ is at the high level "H" and the signal $\phi E$ is at the low level "L", the output signal OUT has the high signal level "H". When the signal $\phi N$ has the high signal level "H" and the signal $\phi E$ has the high signal level "H", the output signal OUT has the high signal level "H" if the input signal IN has the low signal level "L". In contrast, if the input signal IN has the high signal level "H", the output signal OUT has the high signal level "H".

In the case of the circuit of FIG. 16A, if the input signal IN rises when the enable signal φE has the high signal level "H", the input signal IN propagates through a path indicated by an arrow. In contrast, when the enable signal φE has the low signal level "L", the input signal IN does not propagate to an output (line) OUT through the path indicated by the arrow.

FIG. 16C shows a delay circuit in which a plurality of stages of the one-bit delay elements shown in FIG. 16A are cascaded, and this circuit corresponds to an actually used delay circuit. Although FIG. 16C shows only three stages of one-bit delay elements, many stages of one-bit delay elements are actually cascaded. Further, there are provided a plurality of signal lines, such as φE-1, φE-2 and φE-3, corresponding to circuit elements, respectively, for propagating enable signals φE. These enable signals are controlled by a delay controller (32).

In the device of FIG. 16C, when the central one-bit delay circuit or element is activated, the enable signal φE-2 has the high signal level "H". In this case, when the signal level of the input signal IN changes from the low level "L" to the high level "H", the NAND gates 401-1 and 401-3 block the input signal IN as indicated by bold or thick lines, because the signal levels of the enable signals φE-1 and φE-3 respectively corresponding to the leftmost and rightmost one-bit delay elements are the low level "L".

On the other hand, the input signal IN passes through the NAND gate 401-2 because the enable signal φE-2 corresponding to the central activated one-bit delay element has the high level "H". The input signal IN also passes through the NAND gate 402-2 thereof because the output signal OUT of the right-side one-bit delay element has the high signal level "H". Thus, a signal having the low signal level "L" is transmitted as the output signal OUT. As above described, when the output signal OUT, namely, the enable signal φN of the right-hand one-bit delay element has the low signal level "L", the output signal OUT of the one-bit delay element always has the low signal level "L". Accordingly, this signal having the low signal level "L" is transmitted to the NAND gate and the inverter of the left-side one-bit delay element serially, and is extracted as a final output signal.

In this way, the input signal IN is transmitted through an activated one-bit delay element, to form a final output signal. Namely, the delay amount can be controlled by selecting which one of the enable signals φE respectively corresponds to the one-bit delay elements as the signal having the high signal level "H". The delay amount corresponding to one bit is determined according to a total signal propagation delay time of the NAND gates and the inverter of the one-bit delay element and is a unit delay time of the DLL circuit. Further, a total delay time is calculated by multiplying the number of one-bit delay elements, through which the input signal IN passes, by the unit delay time.

Figure 17:
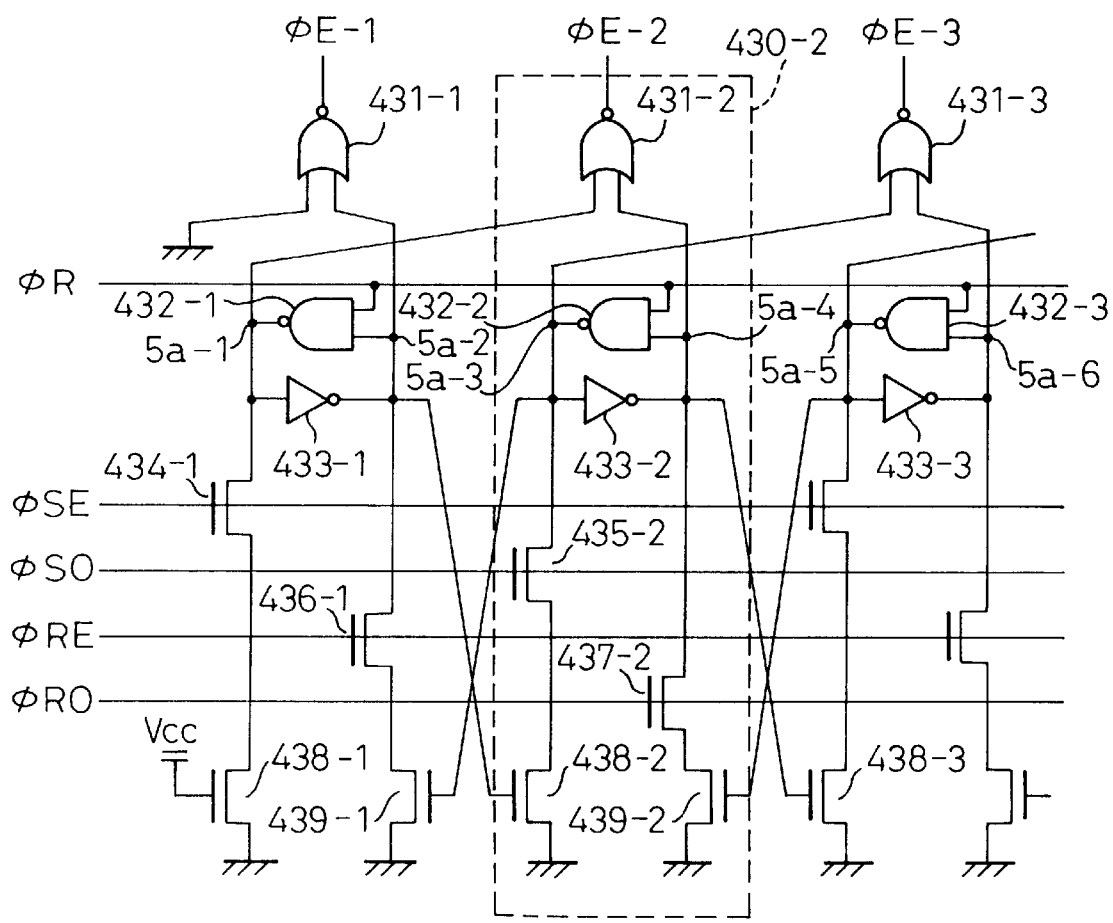
FIG. 17 is a diagram for illustrating the configuration of an example of a delay controller to be provided in the semiconductor circuits of FIGS. 1 and 2.

FIG. 17 is a diagram for illustrating an example of the delay controller (or control circuit) used in the semiconductor integrated circuits of FIGS. 1 and 2.

As shown in FIG. 17, the delay controller comprises one-bit delay control circuits or elements, each of which is a one-bit delay control element 430-2 surrounded by a dotted line in FIG. 17, the number which is equal to that of the stages of one-bit delay elements of the delay circuit. An output of each stage of the delay controller provides an enable signal φE to a corresponding stage of the delay circuit.

To put it concretely, the one-bit delay control circuit or element 430-2 comprises: a flip-flop consisting of a NAND gate 432-2 and an inverter 433-2; transistors 435-2, 437-2, 438-2, and 439-2 connected in series with both ends of the flip-flop; and a NOR gate 431-2. The gate of the transistor 438-2 is connected to a node 5a-2 of the preceding one-bit delay control element. The gate of the transistor 439-2 is connected to a node 5a-5 of the succeeding one-bit delay control element. Thus, the delay control element 430-2 is adapted to receive signals from the preceding and succeeding stages. On the other hand, each of incrementing signals (namely, set signals) φSE and φSO and decrementing signals (namely, reset signals) φRE and φRO is connected to a corresponding one of other transistors, which are connected in series, every other one-bit delay control element.

As shown in FIG. 17, in the central one-bit control element 430-2, the gate of the transistor 435-2 is supplied with the set signal φSO. Further, the gate of the transistor 437-2 is supplied with the reset signal φRO. Moreover, each of the set signal φSE and the reset signal φRE is supplied to a corresponding one of the gates of the transistors provided on the sides of the preceding and succeeding one-bit control elements. Furthermore, the NOR gate 431-2 of the element 430-2 is adapted to receive a signal from a node 5a-1 of the left-side (namely, the preceding) element as viewed in this figure, and to also receive a signal from a node 5a-4 thereof. A signal φR resets the delay controller, and the signal level of the signal φR is temporarily set at the low level "L" after the power source is turned on, and is thereafter fixed at the high level "H".

Figure 18:
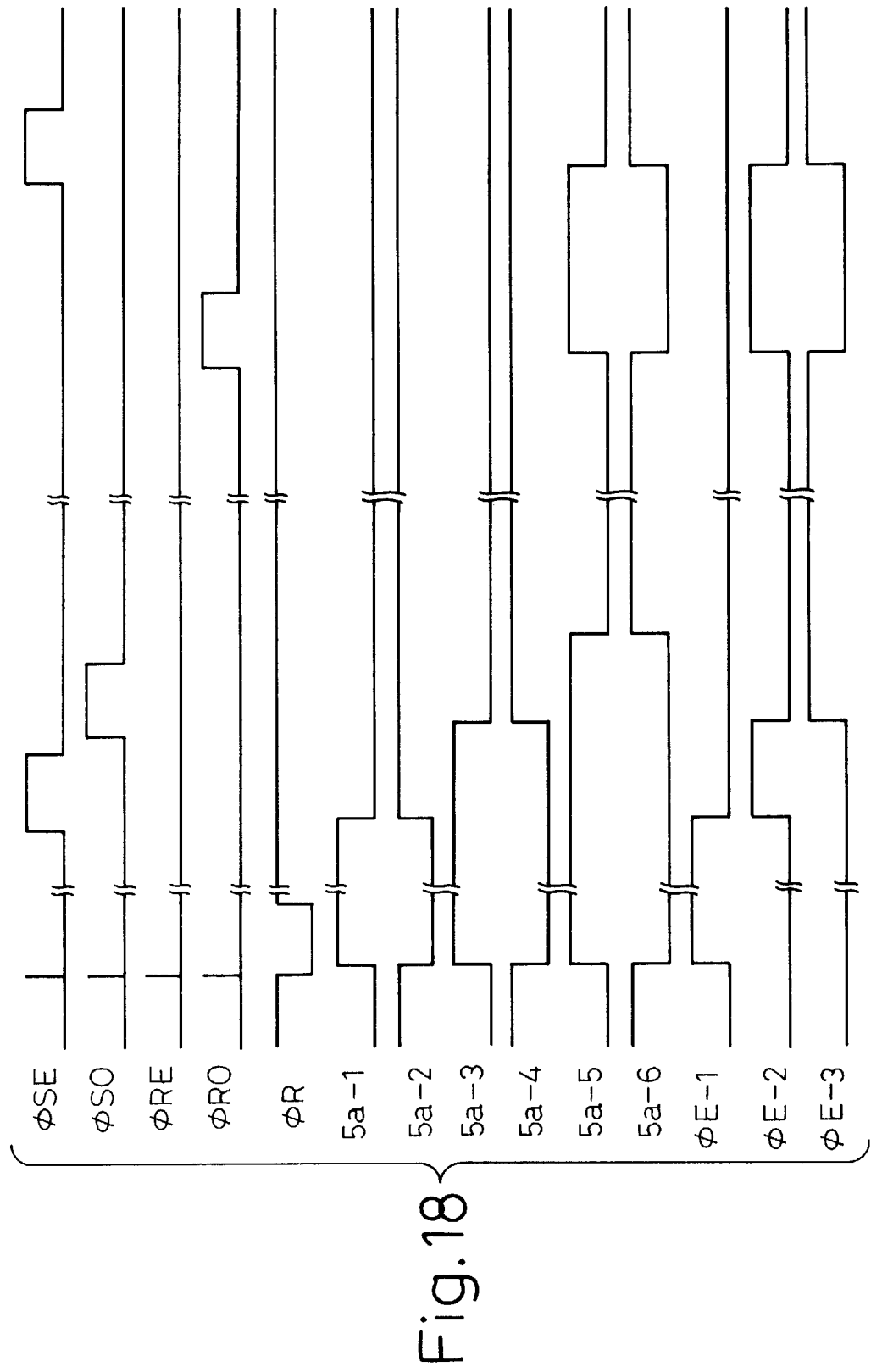
FIG. 18 is a timing chart for illustrating an operation of the delay controller of FIG. 17.

FIG. 18 is a timing chart for illustrating an operation of the delay controller of FIG. 17.

As shown in FIG. 18, the signal level of the reset signal φR is temporarily set at the low level "L", so that the signal levels at the nodes 5a-1, 5a-3 and 5a-5 are set at the high level "H" and that those at the nodes 5a-2, 5a-4 and 5a-6 are reset at the low level "L". Further, when incrementing, the incrementing signals, namely, the set signals φSE and φSO are alternately set at the high level "H" and the low level "L" repeatedly.

When the signal level of the set signal φSE is changed from the low level "L" to the high level "H", the node 5a-1 is grounded and thus is at the low level "L", and then, the signal level at the node 5a-2 is changed to the high level "H". Accordingly, the signal level of the output signal (namely, the enable signal) φE-1 changes from the high level "H" to the low level "L". This state is latched by the flip-flop, and therefore, the signal level of the enable signal φE-1 remains at the low level "L" even if the signal level of the set signal φSE returns to the low level "L". When the signal level at the node 5a-1 changes to the low level "L", the enable signal (namely, the output signal) φE-2 changes from the low level "L" to the high level "H". Because the signal level at the node 5a-2 changes to the high level "H", the transistor 438-2 is turned on. When the signal level of the set signal φSO changes from the low level "L" to the high level "H", the node 5a-3 is grounded and is thus at the low level "L", and the signal level at the node 5a-4 changes to the high level "H". Moreover, in response to this change in the signal level at the node 5a-4 to the high level "H", the signal level of the enable signal φE-2 changes from the high level "H" to the low level "L". This state is latched by the flip-flop, and therefore, the enable signal φE-2 remains at the low level "L" even if the signal level of the set signal φSO returns to the low level "L".

Furthermore, in response to the change in the signal level at the node 5a-3 to the low level "L", the signal level of the enable signal φE-3 changes from the low level "L" to the high level "H". Although pulses of the set signals φSE and φSO are transmitted one by one in the case illustrated in FIG. 11, a large number of stages of one-bit delay control elements are actually connected to one another. Thus, if the set signals φSE and φSO are set at the high level "H" and at the low level "L" alternately and repeatedly, the position of the stage, namely, the one-bit delay control element, which provides the output signal (namely, the enable signal) φE having the high level "H", shifts to the right sequentially. Therefore, if the result of the comparison made by the phase comparator 31 indicates the necessity for increasing a delay amount, it is sufficient to input pulses of the set signals φSE and φSO alternately.

When the incrementing signals (namely, the set signals) φSE and φSO and the decrementing signals (namely, the reset signals) φRE and φRO remain prohibited from being output, namely, remain at the low signal level "L", the position of the stage, namely, the one-bit control element, which provides an enable signal φE having the high signal level "H", is fixed. Accordingly, if the result of the comparison made by the phase comparator 31 reveals the need to maintain a delay amount, pulses of the signals φSE, φSO, φRE and φRO are prevented from being input thereto.

When decrementing, pulses of the reset signals φRE and φRO are alternately input, so that the position of the stage, namely, the one-bit delay control element, which provides the enable signal φE having the high level "H", shifts to the left sequentially.

As above described, in the case of the delay controller shown in FIG. 17, the position of the stage, namely, the one-bit delay control element, which provides an enable signal φE having the high signal level "H", can be shifted one by one. Thus, if the delay circuit illustrated in FIG. 16C is controlled according to these enable signals φE, the delay amount can be controlled by one unit delay time at a time.

Figure 19:
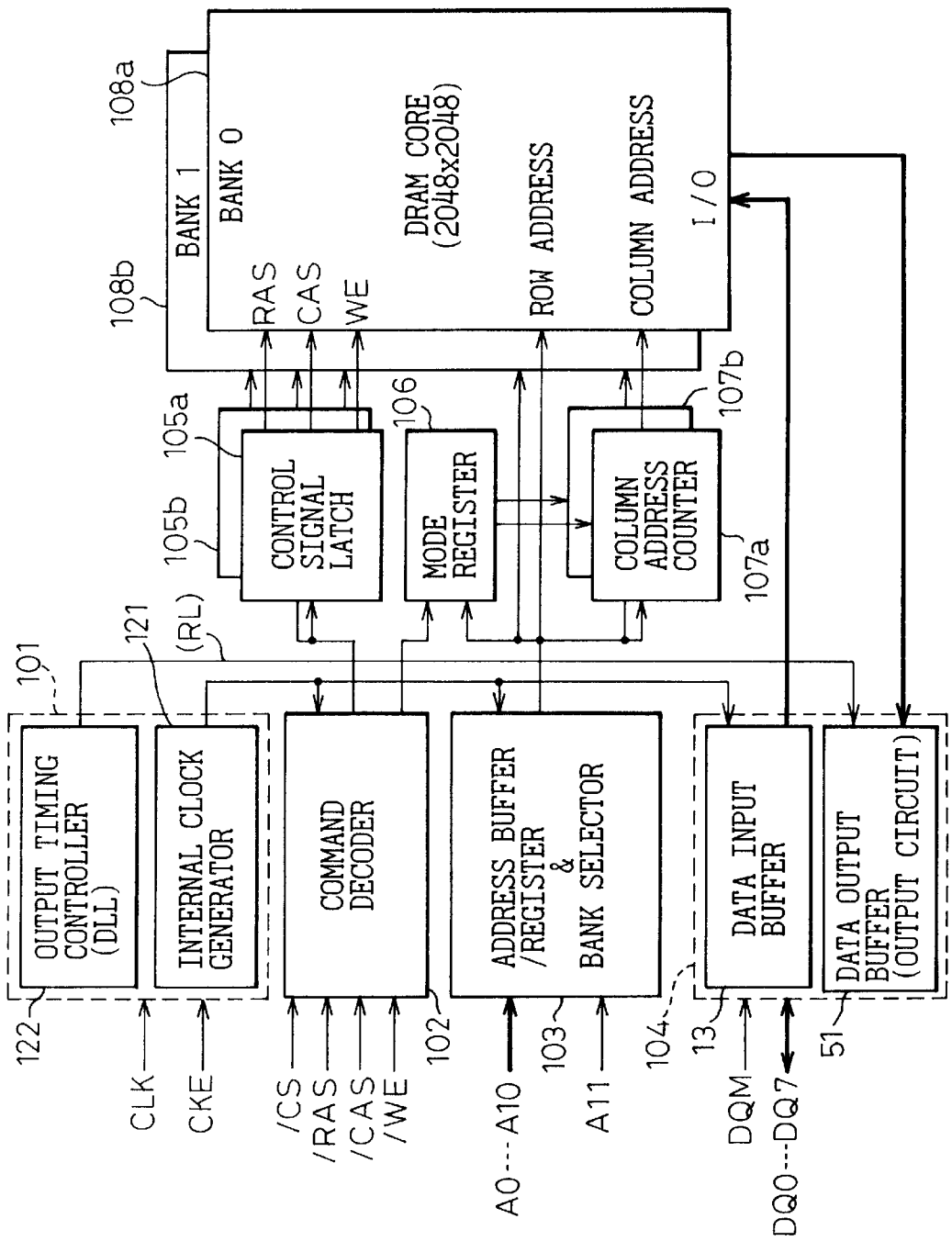
FIG. 19 is a diagram showing the configuration of a synchronous DRAM as an example to which the semiconductor integrated circuit of the present invention is applied.
Figure 20:
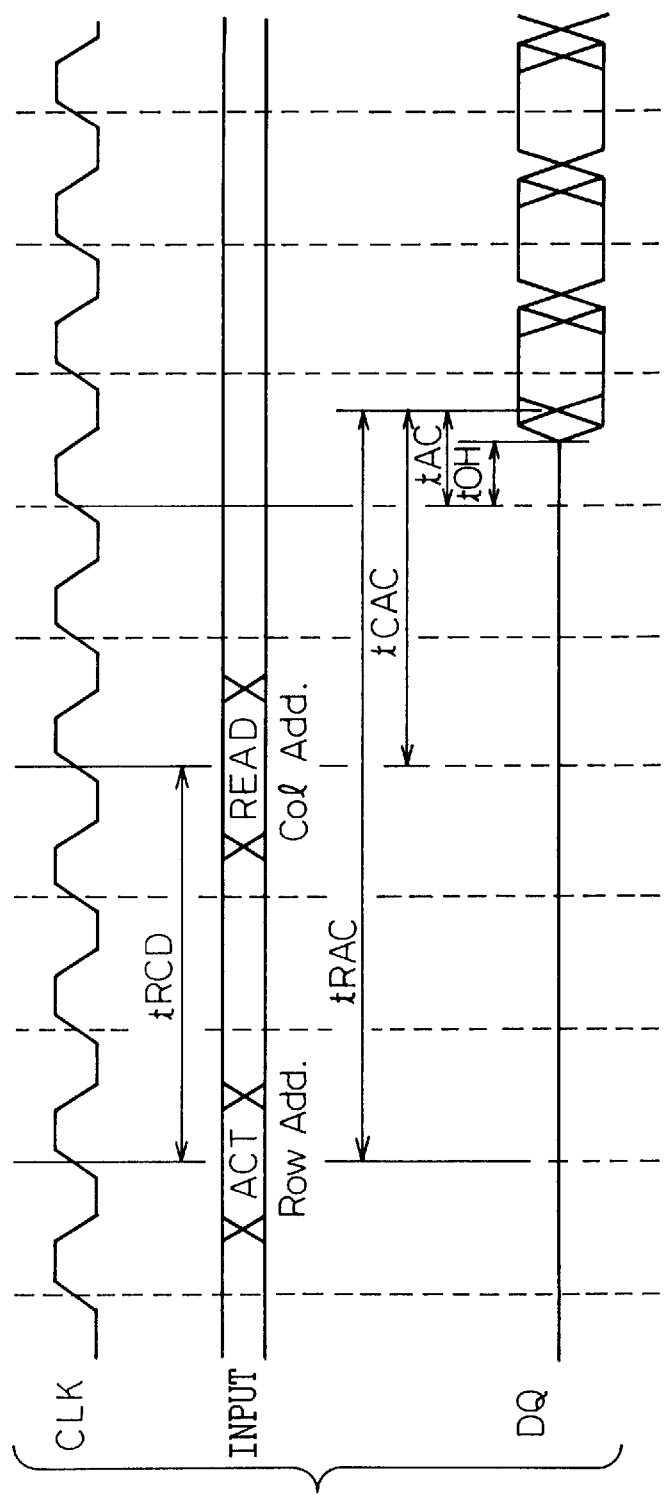
FIG. 20 is a timing chart for illustrating an operation of the synchronous DRAM of FIG. 19.

FIG. 19 is a diagram showing a synchronous DRAM (SDRAM) as an example of a semiconductor integrated circuit to which the present invention is applied, and FIG. 20 is a timing chart for illustrating an operation of the SDRAM of FIG. 19.

This SDRAM, to which the present invention is applied, employs, for instance, a pipeline method and is configured as of the two-bank 8-bit-width 16-Mbit type.

The SDRAM has a clock buffer 101, a command decoder 102, an address buffer/register & bank address selector (briefly, an address buffer) 103, an I/O data buffer/register 104, control signal latches 105a and 105b, a mode register 106, and column address counters 107a and 107b, in addition to DRAM cores 108a and 108b of a general purpose DRAM. Note that regarding /CS, /RAS, /CAS and /WE terminals, an operation mode is determined by inputting various kinds of commands by the use of combinations of such terminals, differently from conventional operations. The various kinds of commands are decoded by the command decoder 102, so that circuits are controlled according to the operation mode. Further, /CS, /RAS, ICAS and /WE signals are also supplied to the control signal latches 105a and 105b, and the states of such signals are latched until the next command is input.

Address signals are amplified by the address buffer 103, and addresses represented by the address signals are used as load (or loading) addresses for the banks, respectively, and initial values for the column address counters 107a and 107b.

The clock buffer 101 has an internal clock generator 121 and an output timing controller 122. The internal clock generator 121 generates an ordinary internal clock signal from an external clock (signal) CLK. Further, the output timing controller 122 is used for generating a clock signal on which an accurate delay control operation (namely, an accurate phase control operation) is performed by applying the aforementioned DLL circuit thereto.

The I/O data buffer/register 104 has a data input buffer 13 and a data output buffer (namely, an output circuit) 51. Data read out of the DRAM cores 108a and 108b is amplified by the data output circuit 51 to a predetermined level. The data is output through pads DQ0 to DQ7 according to clock signals provided from the output timing controller 122. Further, concerning input data, input data to the pads DQ0 to DQ7 is captured through the data input buffer 13. Note that a real line (RL) corresponds to a line or wire extending between the output timing controller 122 and each of the data output circuits 51.

Hereinafter, an operation of reading the aforementioned SDRAM will be described with reference to FIG. 20.

First, various kinds of commands, address signals and input data are input or output data is output in synchronization with a rise of an external clock signal CLK that is supplied from a system using this SDRAM.

In the case of reading data from the SDRAM, among the combinations of command signals (namely, /CS, /RAS, /CAS, and /WE signals), an active (ACT) command is input to a command terminal. On the other hand, a row address signal is input to an address terminal. When such a command and an address are input, the SDRAM is activated, and then a word line corresponding to the row address is selected. Further, cell information on the word line is output to a corresponding bit line, and is then amplified by a sense amplifier.

After an operation time (tRCD) of a part related to the row address, a read command (Read) and a column address are input to the SDRAM. The SDRAM selects sense amplifier data according to the column address, and outputs this data to a data bus line. Subsequently, this data is amplified by a data bus amplifier. Then, such data is further amplified by the output buffer, and the data is output to the output terminal (DQ). A sequence of these operations are the same as those of a general purpose DRAM. In the SDRAM, circuits related to a column address are adapted to perform a pipeline operation. Thus, read data is continuously output in each cycle. Thereby, a data transfer speed or rate is determined by the period or cycle of the external clock signal.

There are three kinds of access time, each of which is defined according to a rise of the clock signal CLK, in SDRAM. In FIG. 20, reference character "tRAC" denotes a row address access time; "tCAC" a column address access time; and "tAC" a clock signal access time. When this SDRAM is used in a high-speed memory system, the time periods tRAC and tCAC, which indicate a period from the inputting of a command to the first obtainment of data, are important. However, as previously described with reference to FIG. 17, the clock signal access time tAC is also important.

Figure 21:
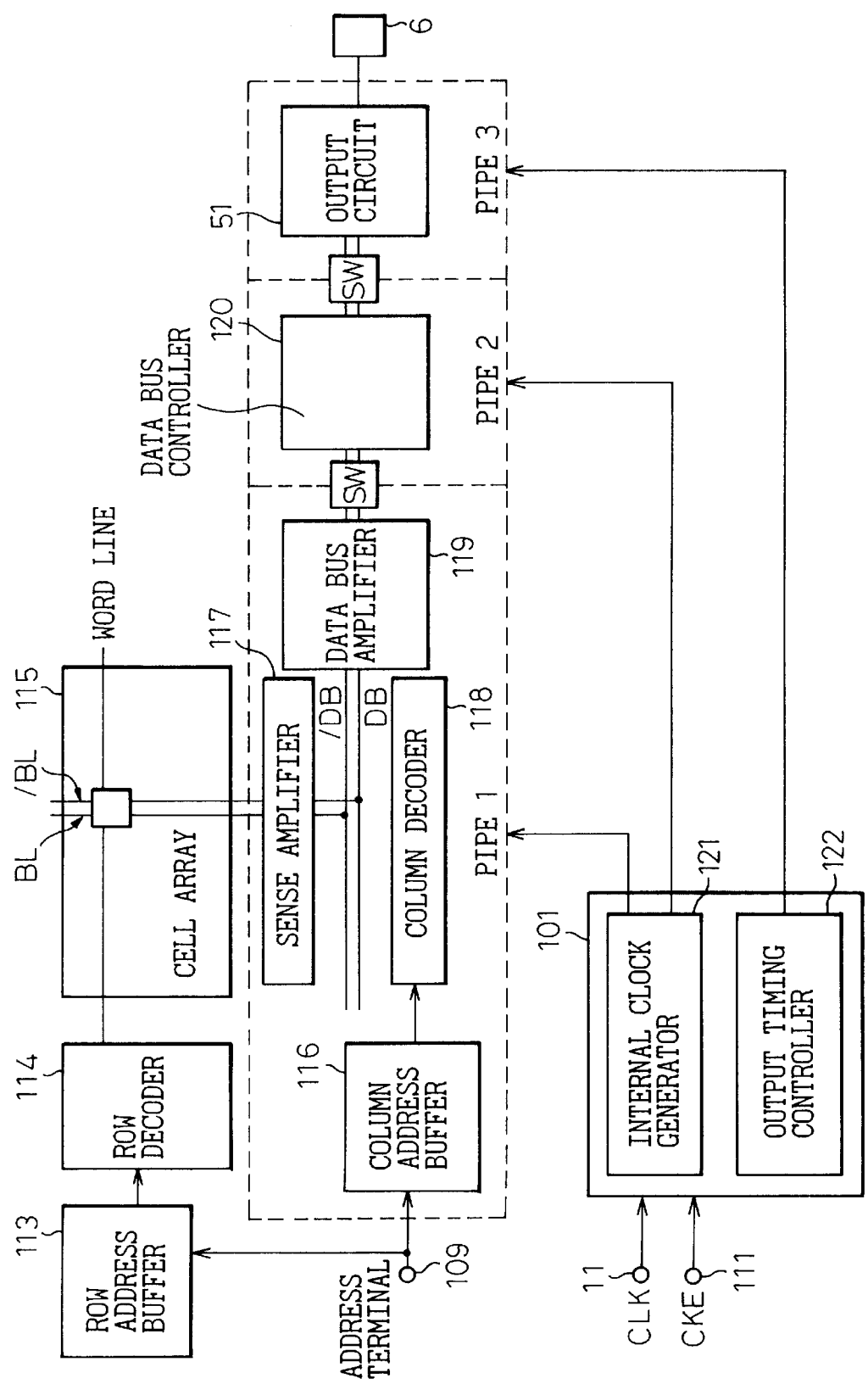
FIG. 21 is a block diagram schematically showing the configuration of a primary part of the synchronous DRAM of FIG. 19.

FIG. 21 is a block diagram, which schematically shows the configuration of a primary part of the SDRAM of FIG. 19, for illustrating a pipeline operation thereof. Further, FIG. 21 illustrates the case that the SDRAM is provided with three stages of pipes, as an example.

A processing circuit relating to a column address in the SDRAM is divided into a plurality of stages along a process (or processing) flow. Each of the divided stages is referred to as a pipe.

As above described with reference to FIG. 19, the clock buffer 101 has the internal clock generator 121 and the output timing controller 122. Outputs (namely, ordinary internal clock signals) of the internal clock generator 121 are supplied to "Pipe 1" and "Pipe 2". Outputs of the output timing controller 122 are supplied to a delay-locked (phase-locked) internal clock signal to the output circuit 51 (namely, the data output buffer) of "Pipe 3".

Each of the pipes is controlled according to the supplied internal clock signal. A switch for controlling the timing of the transmission of a signal between each pair of the adjoining pipes is provided therebetween. These switches are also controlled according to the internal clock signal generated by the clock buffer 101 (namely, the internal clock generator 121). In the case of the example shown in FIG. 21, in the "Pipe 1", an address signal is amplified by a column address buffer 116 and is then sent to a column decoder 118. Subsequently, an address is selected by the column decoder 118. Information on the sense amplifier 117, which is stored at the selected address and corresponds to the selected address, is output to a data bus. This is performed until the data on the data bus is amplified by a data bus amplifier 119. Further, only a data bus controller 120 is provided in the "Pipe 2". The "Pipe 3" is constituted by the I/O buffer 104 (namely, the output circuit 51). Incidentally, the data input buffer 13 in the I/O buffer 104 is omitted in FIG. 21.

Further, if the operation is completed within a clock cycle, the circuits provided in the pipes relay and send out data by opening and closing the switches provided between each pair of the adjoining pipes in synchronization with the clock signal. Thereby, the pipes process data in parallel with one another, so that data is continuously sent to the output terminal in synchronization with the clock signal.

Figure 22:
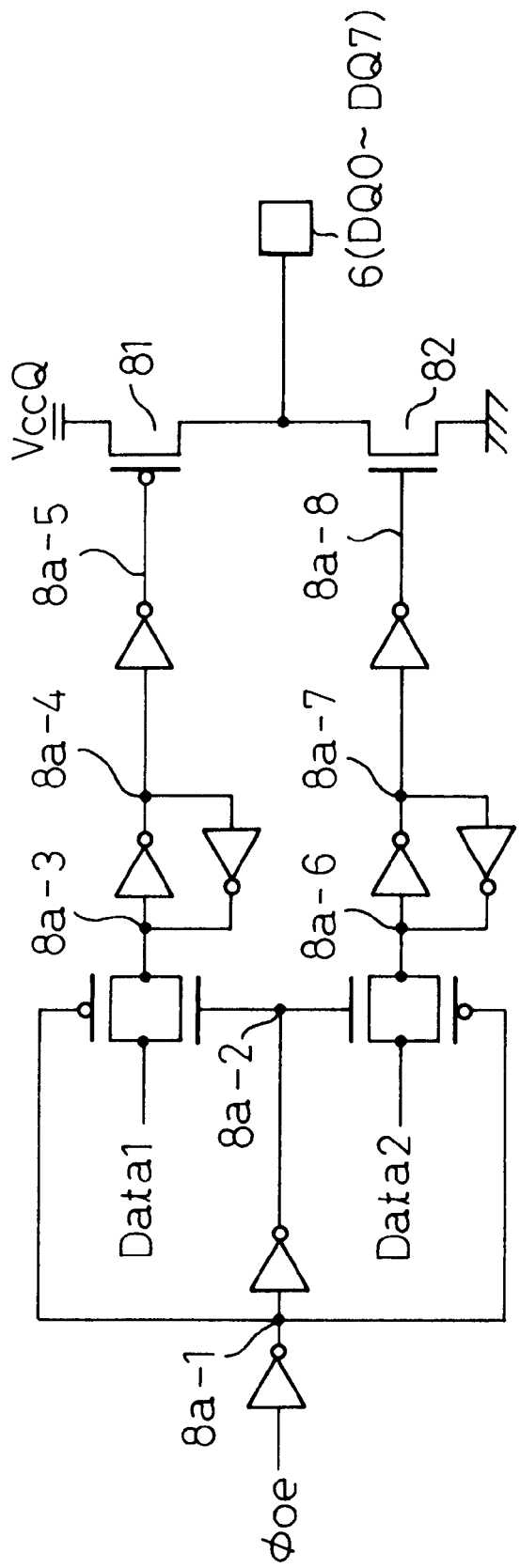
FIG. 22 is a diagram for illustrating the configuration of an example of an output circuit (namely, a data output buffer circuit) provided in the semiconductor integrated circuit of the present invention.

FIG. 22 is a diagram for illustrating the configuration of an example of the output circuit (namely, the data output buffer circuit 51) provided in the semiconductor integrated circuit of the present invention. As illustrated in FIGS. 21 and 22, reference characters "Data1" and "Data2" of FIG. 22 denote signals respectively correspond to stored data read from a cell array 115 through the sense amplifier 117, the data bus amplifier 119, and the data bus controller 120. Both of the signals Data1 and Data2 have the low level "L" when the read data is at the high level "H". Moreover, both of the signals Data1 and Data2 have the low level "H" when the read data is at the low level "L". Incidentally, the read data can be put into a high-impedance state (namely, a high-Z state) in which the data have neither the high level "H" nor the low level "L". In such a case, in the data bus controller 120, the signals are converted into data so that data corresponding to the signal Data1 is at the high level "H" and that data corresponding to the signal Data2 is at the low level "L". A signal φoe corresponds to the output signal (namely, the clock signal) of the output timing controller 122 (corresponding to the delay circuit 33 of FIG. 2) and serves as an enable signal for the output circuit 51.

When the clock signal φoe has the high level "H", information represented by the signals Data1 and Data2 appears at the data output pad 6 (namely, the output pads DQ0 to DQ7). For example, if it is supposed that a signal having the high level "H" is output to the data output pad 6, the signal level of the signal φoe changes from the low level "L" to the high level "H", and the signal level at a node 8a-1 is changed to the low level "L", and the signal level at a node 8a-2 is changed to the high level "H". Then, transfer gates are turned on, so that the signals Data1 and Data2 are transmitted to nodes 8a-3 and 8a-6. As a result, the signal level at a node 8a-5 changes to the low level "L" and the signal level at a node 8a-8 changes to the high level "H". Consequently, a P-channel transistor 81 for output is turned on, and an N-channel transistor 82 is turned off. Consequently, a signal having the high level "H" appears at the data output pad 6. Moreover, when the signal level of the signal φoe changes to the low level "L", the transfer gates are turned off, and the current output state is held.

In the foregoing descriptions, the semiconductor integrated circuit of the present invention has been described as a synchronous DRAM. However, the semiconductor integrated circuit of the present invention is not limited thereto but is applicable to any semiconductor integrated circuit adapted to output an output signal in synchronization with a signal input from the exterior thereof.

FIG. 23 is a diagram for illustrating the configuration of an example of the dummy internal output clock line or wire 42 (namely, the dummy line DL) provided in the semiconductor integrated circuit of the present invention. As is obvious from FIG. 23, the dummy line DL is formed from a line or wire which has the same width as the real line 41 (RL). Note that the dummy line DL is formed on a chip between the dummy delay circuit 34 and the dummy output circuit 52, as shown in FIG. 2. Incidentally, a combination of capacitors or resistors may substitute for such a dummy line.

Although memories (namely, SDRAMs) have been described by way of example in the foregoing descriptions, the present invention is applicable to a wide range of various semiconductor integrated circuits. Moreover, in the foregoing description of each of the aforementioned embodiments, the clock signals have been described as control signals by way of example. Needless to say, the control signals of the present invention are not limited to clock signals.

As above stated in detail, a semiconductor integrated circuit according to the present invention can increase a delay amount which can be corrected at a time in the case that the phase difference between the external clock signal and each of the internal clock signals (namely, the comparison object signal and the comparison reference signal) at, for instance, power-up is large. Further, a semiconductor integrated circuit according to the present invention can shorten the lockup time of the DLL circuit. Thereby, stable and reliable operations of a semiconductor integrated circuit using a DLL circuit can be achieved.

Incidentally, the present invention can provide an advantage in that the lock-up time is reduced, not only when applied to DLL circuit having a frequency divider circuit as illustrated in FIG. 2, but also when applied to a DLL circuit as illustrated in FIG. 1.

Many different embodiments of the present invention may be constructed without departing from the spirit and scope of the present invention. Further, it should be understood that the present invention is not limited to the specific embodiments described in this specification, except as defined in the appended claims.

What is claimed is:

1. A phase comparator comprising:
   a first phase comparing portion for comparing a phase difference, between a comparison reference signal and a comparison object signal with a first value;
   a second phase comparing portion for comparing the phase difference, between the comparison reference signal and the comparison object signal with a second value not equal to the first value; and
   a pulse number control section for controlling a number of pulses to be output according to a comparing result by said first and second phase comparing portions.

2. A phase comparator as claimed in claim 1, wherein said pulse number control section comprises:
   an oscillator circuit for generating pulse signals;
   a counter circuit for counting an output of said oscillator circuit; and
   an oscillator control circuit for controlling an operation of said oscillator circuit according to a count value of said counter circuit and a result of the judgement made by said phase comparing section.

3. A delay locked loop circuit comprising:
   a delay circuit for applying a delay amount to a first input control signal and for outputting a second control signal;
   a dummy delay circuit for receiving a signal corresponding to the first control signal and for outputting a signal to which a same delay amount as applied by said delay circuit is applied;
   a delay control circuit for controlling both of the delay amounts in said delay circuit and said dummy delay circuit as a same value; and
   a phase comparator, for receiving a signal corresponding to the first control signal as a comparison reference signal, for receiving an output signal from said dummy delay circuit through a predetermined circuit as a comparison object signal, and for supplying a predetermined number of pulse signals to said delay control circuit according to a phase difference between the comparison reference signal and the comparison object signal, thereby controlling a delay amount in each of said delay circuit and said dummy delay circuit, wherein said phase comparator comprises:
      a phase comparing section for making a determination by comparing the phase difference between the comparison reference signal and the comparison object signal with a predetermined value; and
      a pulse number control section for controlling a number of pulses to be output according to a result of the determination made by said phase comparing section, wherein the predetermined value to be compared with the phase difference between the comparison reference signal and the comparison object signal is determined by using a delay amount of a single delay stage which is a unit element for constituting said delay circuit and said dummy delay circuit.

4. A delay locked loop circuit as claimed in claim 3, wherein said phase comparing section comprises:
   a first phase comparing portion for making a judgment by comparing the phase difference between the comparison reference signal and the comparison object signal with a first delay amount of m delay stages, where m is a natural number; and
   a second phase comparing portion for making a judgement by comparing the phase difference between the comparison reference signal and the comparison object signal with a second delay amount of n delay stages, where n is a natural number; and m is smaller than n, wherein said pulse control section controls a number of pulses to be output according to results of the judgments made by said first and second phase comparing portions.

5. A delay locked loop circuit as claimed in claim 4, wherein said phase comparing section is adapted to set "JUST" as a result of the judgement if the phase difference between the comparison reference signal and the comparison object signal is less than the first delay amount of m delay stages, and to set the number of pulses output by said pulse number control section at zero and to maintain the delay amounts caused in said delay circuit and said dummy delay circuit;
   wherein said phase comparing section is adapted to set "FAST" or "SLOW" as a result of the judgement if the phase difference between the comparison reference signal and the comparison object signal is not less than the first delay amount of m delay stages and is not more than the second delay amount of n delay stages, and to set the number of pulses output by said pulse number control section at a first number and to correct the delay amount caused in each of said delay circuit and said dummy delay circuit; and
   wherein said phase comparing section is adapted to set "VERY FAST" or "VERY SLOW" as a result of the judgement if the phase difference between the comparison reference signal and the comparison object signal is more than the second delay amount of n delay stages, and to set the number of pulses output by said pulse number control section at a second number that is more than the first number, and to correct the delay amount caused in each of said delay circuit and said dummy delay circuit by an amount that is more than an amount by which the delay amount is corrected in a case where the number of pulses is set at the first number.

6. A delay locked loop circuit as claimed in claim 5, wherein the control signal supplied from said phase comparator to said delay control circuit includes an addition control signal for even-numbered delay stages, an addition control signal for odd-numbered delay stages, a subtraction control signal for even-numbered delay stages, and a subtraction control signal for odd-numbered delay stages;
   wherein the addition control signal for even-numbered delay stages and/or the addition control signal for odd-numbered delay stages is output according to the number of pulses, which are output by said pulse number control portion, and the delay amount caused in each of said delay circuit and said dummy delay circuit is increased when a phase of the comparison object signal is ahead of a phase of the comparison reference signal; and
   wherein the subtraction control signal for even-numbered delay stages and/or the subtraction control signal for odd-numbered delay stages is output according to the number of pulses, which are output by said pulse number control portion, and the delay amount caused in each of said delay circuit and said dummy delay circuit is decreased when the phase of the comparison object signal is behind the phase of the comparison reference signal.

7. A delay locked loop circuit as claimed in claim 3, wherein said pulse number control section comprises:
   an oscillator circuit for generating pulse signals;
   a counter circuit for counting an output of said oscillator circuit; and
   an oscillator control circuit for controlling an operation of said oscillator circuit according to a count value of said counter circuit and a result of the judgement made by said phase comparing section.

8. A delay locked loop circuit as claimed in claim 3, wherein said delay control circuit includes a shift register, and a pulse signal output from said pulse number control section is adapted to determine a delay amount caused in each of said delay circuit and said dummy delay circuit which are controlled by said shift register.

9. A delay locked loop circuit as claimed in claim 3, wherein said delay locked loop circuit further comprises a frequency divider circuit to which the first control signal is supplied, and an output signal of said frequency divider circuit is supplied to said dummy delay signal and is also supplied as the comparison reference signal for said phase comparator.

10. A semiconductor integrated circuit having a delay locked loop circuit, said delay locked loop circuit comprising:
- a delay circuit for applying a delay amount to a first input control signal and for outputting a second control signal;
- a dummy delay circuit for receiving a signal corresponding to the first control signal and for outputting a signal to which a same delay amount as applied by said delay circuit is applied;
- a delay control circuit for controlling both of the delay amounts in said delay circuit and said dummy delay circuit as a same value; and
- a phase comparator, for receiving a signal corresponding to the first control signal as a comparison reference signal, for receiving an output signal from said dummy delay circuit through a predetermined circuit as a comparison object signal, and for supplying a predetermined number of pulse signals to said delay control circuit according to a phase difference between the comparison reference signal and the comparison object signal, thereby controlling a delay amount in each of said delay circuit and said dummy delay circuit, wherein the second control signal output from said delay circuit is supplied to an object circuit through a real line, an output signal of said dummy delay circuit is supplied to said phase comparator through a dummy section corresponding to both of said real line and said object circuit as the comparison object signal, wherein said phase comparator comprises:
  - a phase comparing section for making a determination by comparing the phase difference between the comparison reference signal and the comparison object signal with a predetermined value; and
  - a pulse number control section for controlling a number of pulses to be output according to a result of the determination made by said phase comparing section, wherein the predetermined value to be compared with the phase difference between the comparison reference signal and the comparison object signal is determined by using a delay amount of a single delay stage which is a unit element for constituting said delay circuit and said dummy delay circuit.

11. A semiconductor integrated circuit as claimed in claim 10, wherein said phase comparing section comprises:
- a first phase comparing portion for making a judgment by comparing the phase difference between the comparison reference signal and the comparison object signal with a first delay amount of m delay stages, where m is a natural number; and
- a second phase comparing portion for making a judgement by comparing the phase difference between the comparison reference signal and the comparison object signal with a second delay amount of n delay stages, where n is a natural number; and m is smaller than n, wherein said pulse control section controls a number of pulses to be output according to results of the judgments made by said first and second phase comparing portions.

12. A semiconductor integrated circuit as claimed in claim 11, wherein said phase comparing section is adapted to set "JUST" as a result of the judgement if the phase difference between the comparison reference signal and the comparison object signal is less than the first delay amount of m delay stages, and to set the number of pulses output by said pulse number control section at zero and to maintain the delay amounts caused in said delay circuit and said dummy delay circuit;

wherein said phase comparing section is adapted to set "FAST" or "SLOW" as a result of the judgement if the phase difference between the comparison reference signal and the comparison object signal is not less than the first delay amount of m delay stages and is not more than the second delay amount of n delay stages, and to set the number of pulses output by said pulse number control section at a first number and to correct the delay amount caused in each of said delay circuit and said dummy delay circuit; and wherein said phase comparing section is adapted to set "VERY FAST" or "VERY SLOW" as a result of the judgement if the phase difference between the comparison reference signal and the comparison object signal is more than the second delay amount of n delay stages, and to set the number of pulses output by said pulse number control section at a second number that is more than the first number, and to correct the delay amount caused in each of said delay circuit and said dummy delay circuit by an amount that is more than an amount by which the delay amount is corrected in a case where the number of pulses is set at the first number.

13. A semiconductor integrated circuit as claimed in claim 12, wherein the control signal supplied from said phase comparator to said delay control circuit includes an addition control signal for even-numbered delay stages, an addition control signal for odd-numbered delay stages, a subtraction control signal for even-numbered delay stages, and a subtraction control signal for odd-numbered delay stages;

wherein the addition control signal for even-numbered delay stages and/or the addition control signal for odd-numbered delay stages is output according to the number of pulses, which are output by said pulse number control portion, and the delay amount caused in each of said delay circuit and said dummy delay circuit is increased when a phase of the comparison object signal is ahead of a phase of the comparison reference signal; and wherein the subtraction control signal for even-numbered delay stages and/or the subtraction control signal for odd-numbered delay stages is output according to the number of pulses, which are output by said pulse number control portion, and the delay amount caused in each of said delay circuit and said dummy delay circuit is decreased when the phase of the comparison object signal is behind the phase of the comparison reference signal.

14. A semiconductor integrated circuit as claimed in claim 10, wherein said pulse number control section comprises:
- an oscillator circuit for generating pulse signals;
- a counter circuit for counting an output of said oscillator circuit; and
- an oscillator control circuit for controlling an operation of said oscillator circuit according to a count value of said counter circuit and a result of the judgement made by said phase comparing section.

15. A semiconductor integrated circuit as claimed in claim 10, wherein said delay control circuit includes a shift register, and a pulse signal output from said pulse number control section is adapted to determine a delay amount caused in each of said delay circuit and said dummy delay circuit which are controlled by said shift register.

16. A semiconductor integrated circuit as claimed in claim 10, wherein said delay locked loop circuit further comprises a frequency divider circuit to which the first control signal is supplied, and an output signal of said frequency divider circuit is supplied to said dummy delay signal and is also supplied as the comparison reference signal for said phase comparator.

17. A semiconductor integrated circuit as claimed in claim 10, wherein said semiconductor integrated circuit is a synchronous DRAM, wherein said object circuit is an output circuit of said synchronous DRAM.

18. A phase adjustment circuit, comprising:

a delay circuit including a plurality of delay units connected in series, the delay circuit delaying an input signal for a delay time responsive to selected number of the delay units;

a first phase comparator for comparing a phase difference between a reference signal originated from the input signal and an object signal, with a first value;

a delay controller for shifting the delay time for a plurality of the delay units in response to a comparison result of the first phase comparator; and a second phase comparator for comparing the phase difference between the reference signal and the object signal, with a second value which is smaller than the first value; wherein the delay controller shifts the delay time for one delay unit in response to the comparison result of the second phase comparator.

19. A phase adjustment circuit as claimed in claim 18, wherein the first value is the same as the delay time for the plurality of the delay units.

* * * * *